US012665616B2

(12) United States Patent
Takahashi et al.

(10) Patent No.: US 12,665,616 B2
(45) Date of Patent: Jun. 23, 2026

(54) COMMUNICATION DEVICE AND COMMUNICATION METHOD FOR REALIZING HIGH FREQUENCY UTILISATION EFFICIENCY

(71) Applicant: SONY GROUP CORPORATION, Tokyo (JP)

(72) Inventors: Mitsuki Takahashi, Tokyo (JP); Hiroki Matsuda, Tokyo (JP); Ryota Kimura, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 94 days.

(21) Appl. No.: 18/568,057

(22) PCT Filed: Mar. 1, 2022

(86) PCT No.: PCT/JP2022/008475
§ 371 (c)(1),
(2) Date: Dec. 7, 2023

(87) PCT Pub. No.: WO2022/264538
PCT Pub. Date: Dec. 22, 2022

(65) Prior Publication Data
US 2024/0283468 A1 Aug. 22, 2024

(30) Foreign Application Priority Data
Jun. 16, 2021 (JP) ................................. 2021-100057

(51) Int. Cl.
*H03M 13/37* (2006.01)
*H03M 13/00* (2006.01)
(Continued)

(52) U.S. Cl.
CPC ..... *H03M 13/3761* (2013.01); *H03M 13/353* (2013.01); *H03M 13/373* (2013.01); *H04L 1/0061* (2013.01)

(58) Field of Classification Search
CPC .. H03M 13/09; H03M 13/353; H03M 13/373; H03M 13/3761; H04L 1/0041;
(Continued)

(56) References Cited

U.S. PATENT DOCUMENTS 8,489,954 B2 * 7/2013 Seferoglu ............. H04L 1/0009
714/752
8,583,981 B2 * 11/2013 Varnica ............... G06F 11/1008
714/755
(Continued)

FOREIGN PATENT DOCUMENTS

JP      2007-503174 A      2/2007
JP      2011-199647 A      10/2011
(Continued)

OTHER PUBLICATIONS

International Search Report and Written Opinion of PCT Application No. PCT/JP2022/008475, issued on May 31, 2022, 11 pages of ISRWO.
(Continued)

*Primary Examiner* — Justin R Knapp
(74) *Attorney, Agent, or Firm* — CHIP LAW GROUP

(57) ABSTRACT
A communication device includes a generation unit that generates error detection data and an addition unit that adds redundant data including the error detection data to one or a plurality of encoded sequences generated by encoding processing, in which the error detection data is used for error detection of the one or the plurality of encoded sequences. The generation unit generates the error detection data having different lengths according to a predetermined condition.

19 Claims, 14 Drawing Sheets

(51) Int. Cl.
　　H03M 13/35　　　(2006.01)
　　H04L 1/00　　　　(2006.01)
(58) Field of Classification Search
　　CPC ... H04L 1/0061; H04L 1/0064; H04L 1/0007;
　　　　　　　　　　　　H04L 1/0009; Y02D 30/70
　　See application file for complete search history.

(56)　　　　　　　　References Cited

U.S. PATENT DOCUMENTS

| | | | |
|---|---|---|---|
| 10,931,410 B2 * | 2/2021 | Wang | ................... H04L 1/0018 |
| 12,045,130 B2 * | 7/2024 | Fisher | ................ G06F 11/0727 |
| 2004/0158794 A1 | 8/2004 | Niesen | |
| 2018/0048421 A1 | 2/2018 | Yeo et al. | |
| 2018/0199331 A1 | 7/2018 | Wang et al. | |
| 2020/0213032 A1 | 7/2020 | Yeo | |

FOREIGN PATENT DOCUMENTS

| | | | |
|---|---|---|---|
| JP | 2014-532371 | A | 12/2014 |
| JP | 2020-515189 | A | 5/2020 |
| WO | 2007/069406 | A1 | 6/2007 |
| WO | WO-2010019615 | A2 | 2/2010 |
| WO | 2020/166229 | A1 | 8/2020 |

OTHER PUBLICATIONS

"Investigation of LDPC codes with CRC attachment", Ericsson, 3GPP TSG RAN WG1 AH_NR Meeting, R1-1700109, Jan. 16-20, 2017, 6 pages.

* cited by examiner

INFORMATION
SEQUENCE
FROM UPPER
LAYER

INFORMATION
SEQUENCE TO
UPPER LAYER

ONE BIT SEQUENCE

DIVIDE

PLURALITY OF
SOURCE BIT
SEQUENCES

ERROR
CORRECTION
ENCODING

PLURALITY OF
PARITY BIT
SEQUENCES

ADD

PLURALITY OF
SOURCE BIT SEQUENCES

PLURALITY OF
PARITY BIT SEQUENCES

PLURALITY OF BIT SEQUENCES

COMMUNICATION DEVICE AND COMMUNICATION METHOD FOR REALIZING HIGH FREQUENCY UTILISATION EFFICIENCY

CROSS REFERENCE TO RELATED APPLICATIONS

This application is a U.S. National Phase of International Patent Application No. PCT/JP2022/008475 filed on Mar. 1, 2022, which claims priority benefit of Japanese Patent Application No. JP 2021-100057 filed in the Japan Patent Office on Jun. 16, 2021. Each of the above-referenced applications is hereby incorporated herein by reference in its entirety.

FIELD

The present disclosure relates to a communication device and a communication method.

BACKGROUND

In wireless communication, in order for a communication device to accurately transmit data to another communication device, it is necessary to transmit various data separately from data such as user data. For example, the communication device may transmit redundant data such as error detection data separately from data such as user data. By performing error detection or the like using redundant data, it is possible to transmit data with very high accuracy.

CITATION LIST

Patent Literature

Patent Literature 1: WO 2007/069406 A

SUMMARY

Technical Problem

From the viewpoint of reducing a transmission amount of the redundant data and increasing the frequency utilization efficiency, it is desirable that a length of the redundant data is shorter. On the other hand, from the viewpoint of reducing the retransmission of data due to erroneous determination of an error detection function and increasing the frequency utilization efficiency, it is necessary to increase the length of the redundant data in order to improve the accuracy of the error detection. However, the length of the redundant data has not been studied much so far, and the communication device has not necessarily achieved high frequency utilization efficiency.

Therefore, the present disclosure proposes a communication device and a communication method capable of realizing high frequency utilization efficiency.

Note that the above problem or object is merely one of a plurality of problems or objects that can be solved or achieved by a plurality of embodiments disclosed in the present specification.

Solution to Problem

In order to solve the above problem, a communication device according to one embodiment of the present disclosure includes: a generation unit that generates error detection data; and an addition unit that adds redundant data including the error detection data to one or a plurality of encoded sequences generated by encoding processing, wherein the error detection data is used for error detection of the one or the plurality of encoded sequences, and the generation unit generates the error detection data having different lengths according to a predetermined condition.

DESCRIPTION OF EMBODIMENTS

Figure 1:
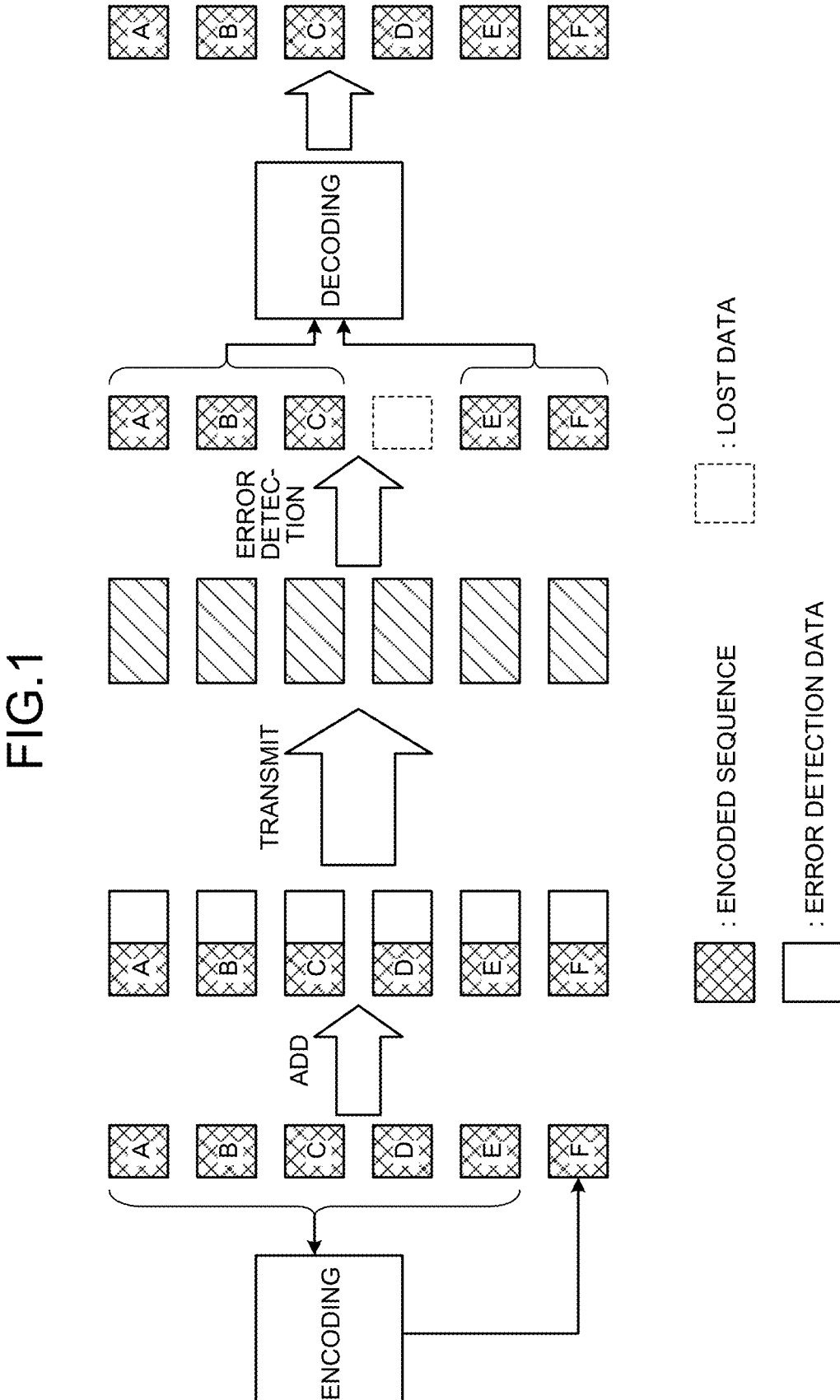
FIG. 1 is a schematic diagram in a case where an erasure correction encoding method is used for communication.

Hereinafter, embodiments of the present disclosure will be described in detail with reference to the drawings. Note that, in each of the following embodiments, the same parts are denoted by the same reference signs, and redundant description will be omitted.

Furthermore, in the present specification and the drawings, a plurality of constituent elements having substantially the same functional configuration may be distinguished by attaching different numerals after the same reference signs. For example, a plurality of configurations having substantially the same functional configuration is distinguished as terminal devices $40_1$, $40_2$, and $40_3$ as necessary. However, in a case where it is not particularly necessary to distinguish each of a plurality of constituent elements having substantially the same functional configuration, only the same reference sign is attached. For example, in a case where it is not necessary to particularly distinguish the terminal devices $40_1$, $40_2$, and $40_3$, they are simply referred to as terminal devices 40.

One or a plurality of embodiments (including examples and modification examples) described below can each be implemented independently. On the other hand, at least some of the plurality of embodiments described below may be implemented by being appropriately combined with at least some of other embodiments. The plurality of embodiments may include novel features different from each other. Therefore, the plurality of embodiments can contribute to solving different objects or problems, and can exhibit different effects.

1. Overview

Radio access technology (RAT) such as long term evolution (LTE) and new radio (NR) has been studied in the third generation partnership project (3GPP). LTE and NR are a type of cellular communication technology, and enable mobile communication of a terminal device by arranging a plurality of areas covered by a base station in a cell shape. At this time, a single base station may manage a plurality of cells.

Note that, in the following description, "LTE" includes LTE-Advanced (LTE-A), LTE-Advanced Pro (LTE-A Pro), and evolved universal terrestrial radio access (E-UTRA). Furthermore, the NR includes new radio access technology (NRAT) and further E-UTRA (FE-UTRA). In the following description, a cell corresponding to LTE is referred to as an LTE cell, and a cell corresponding to NR is referred to as an NR cell.

NR is a next generation (fifth generation) radio access technology (RAT) of LTE. The NR is a radio access technology that can support various use cases including enhanced mobile broadband (eMBB), massive machine type communications (mMTC), and ultra-reliable and low latency communications (URLLC). The NR has been studied aiming at a technical framework corresponding to usage scenarios, requirement conditions, arrangement scenarios, and the like in these use cases.

A frequency band (or a frequency band assumed to be used in beyond 5th generation (B5G) or 6th generation (6G)) used in NR is a millimeter wave (30-300 GHz) or a terahertz wave (assuming 300 GHz-3 THz). These frequency bands have lower diffraction properties than those used in LTE, and are greatly affected by shadowing and blocking.

The forward error correction code (Hereinafter, it is also referred to as forward error correction (FEC).) implemented in a physical layer is an encoding method assuming that error correction is performed in units of bits using likelihood information. When a packet is lost due to blocking or shadowing, the likelihood information obtained on a reception side is 0. Therefore, in a case where the high frequency band as described above is used for communication, it is necessary to consider the use of an error correction code other than the forward error correction code in units of bits.

There is a forward error correction code that corrects an error in a unit of an information sequence (Hereinafter, it is also referred to as a symbol and a bit block.) formed by a plurality of bits (Here, the unit is a symbol or an encoded sequence.). A configuration in which this code is used for wireless communication is also referred to as network coding. In a case where this encoding method is used, the communication device on a transmission side generates parity by bit operation using a plurality of information systems. The communication device on a reception side attempts decoding by using the transmitted information sequence and parity. One of the encoding methods is an erasure correction encoding method.

FIG. 1 is a schematic diagram in a case where an erasure correction encoding method is used for communication. In the drawing, one parity (F in the drawing) is generated from a plurality of information sequences (A to E in the drawing) on the transmission side. Data (error detection data in the drawing) for detecting an error is added to each information sequence. The reception side performs error detection on each received information sequence. Thereafter, only the correctly received encoded sequence is inserted into the decoder, and the lost symbol (D in the drawing) is restored.

In general, in a case where an error detection capability is given to an information sequence, an additional overhead (Hereinafter, it is also referred to as redundant data or error detection data.) having an error detection function is added to an information sequence to be subjected to error detection. In a cyclic redundancy check (CRC) which is a widely used error detection function, there is a positive proportional relationship between error detection accuracy and an overhead length. Furthermore, it is known that a length of the information sequence in which an error can be detected changes according to an order of a generator polynomial used in the CRC encoding. Therefore, longer redundant data is required to obtain higher detection accuracy.

In this regard, the conventional communication device provides error detection data of a certain length under any condition. For example, the conventional communication device provides a CRC having a certain length regardless of a length of the encoded sequence or a state of a communication path. Therefore, depending on the condition, the length of the error detection data (for example, CRC) becomes excessive. That is, in a case where the length of the encoded sequence is short or in a case where the communication path is in a good state in which few errors occur (for example, in a case where it is estimated that the error rate is not so high), the communication device uses the CRC having an overhead length more than necessary. In this case, the frequency utilization efficiency decreases.

Therefore, in the present embodiment, this problem is solved by the following means.

The communication device (for example, a base station and a terminal device) according to the present embodiment generates error detection data (for example, a value generated by CRC processing) for detecting an error of one or a plurality of encoded sequences generated by the erasure correction encoding processing, and adds redundant data including the error detection data to the one or the plurality of encoded sequences. At this time, the communication device generates error detection data having different lengths according to a predetermined condition. For example, the communication device generates error detection data having a length determined based on a length of the one or the plurality of encoded sequences. Alternatively, the communication device generates error detection data having a length determined based on an error rate estimated when the one or the plurality of encoded sequences are transmitted. As a result, the communication device according to the present embodiment can add redundant data of an appropriate length to the encoded sequence, and thus, can realize high frequency utilization efficiency. Furthermore, the length of data in the present disclosure may be rephrased as a size of data.

Although the overview of the present embodiment has been described above, the communication system according to the present embodiment will be described in detail below.

2. Configuration of Communication System

Hereinafter, a configuration of the communication system 1 will be specifically described with reference to the drawings.

2-1. Overall Configuration of Communication System

Figure 2:
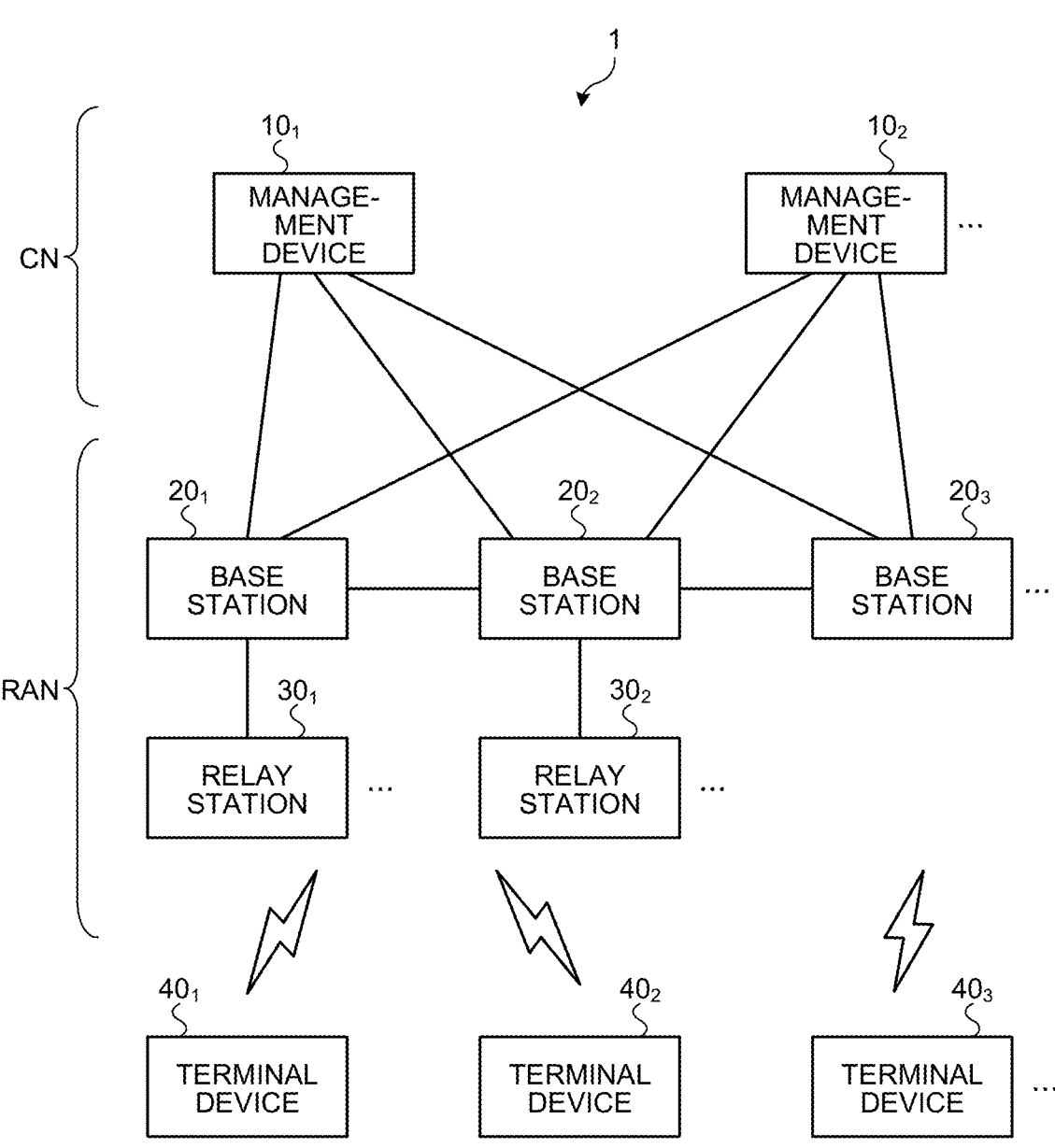
FIG. 2 is a diagram illustrating a configuration example of a communication system according to an embodiment of the present disclosure.

FIG. 2 is a diagram illustrating a configuration example of the communication system 1 according to the embodiment of the present disclosure. The communication system 1 includes a management device 10, a base station 20, a relay station 30, and a terminal device 40. The communication system 1 provides a user with a wireless network capable of mobile communication by operating in cooperation with each wireless communication device that configures the communication system 1. The wireless network of the present embodiment includes, for example, a radio access network and a core network. Note that, in the present embodiment, the wireless communication device is a device having a function of wireless communication, and corresponds to the base station 20, the relay station 30, and the terminal device 40 in the example of FIG. 2.

The communication system 1 may include a plurality of the management devices 10, a plurality of the base stations 20, a plurality of the relay stations 30, and a plurality of the terminal devices 40. In the example of FIG. 2, the communication system 1 includes management devices $10_1$ and $10_2$ and the like as the management devices 10, and includes base stations $20_1$ and $20_2$ and the like as the base stations 20. Furthermore, the communication system 1 includes relay stations $30_1$ and $30_2$ and the like as the relay stations 30, and includes terminal devices $40_1$, $40_2$, and $40_3$ and the like as the terminal devices 40.

Note that the devices in the drawing may be considered as devices in a logical sense. That is, a part of the device in the drawing may be realized by a virtual machine (VM), a container, a docker, or the like, and they may be implemented on physically the same hardware.

Note that the communication system 1 may support a radio access technology (RAT) such as long term evolution (LTE) or new radio (NR). LTE and NR are a type of cellular communication technology, and enable mobile communication of a terminal device by arranging a plurality of areas covered by a base station in a cell shape.

Note that the radio access method used by the communication system 1 is not limited to LTE and NR, and may be another radio access method such as wideband code division multiple access (W-CDMA) or code division multiple access 2000 (cdma2000).

Furthermore, the base station or the relay station constituting the communication system 1 may be a ground station or a non-ground station. The non-ground station may be a satellite station or an aircraft station. When the non-ground station is a satellite station, the communication system 1 may be a Bent-pipe (Transparent) type mobile satellite communication system.

Note that, in the present embodiment, the ground station (It is also referred to as a ground base station.) refers to a base station (a relay station.) installed on the ground. Here, the "ground" is a ground in a broad sense including not only land but also underground, above water, and underwater.

Note that, in the following description, the description of "ground station" may be replaced with "gateway".

Note that an LTE base station may be referred to as an evolved node B (eNodeB) or an eNB. Furthermore, an NR base station may be referred to as a gNodeB or a gNB. Furthermore, in LTE and NR, a terminal device (It is also referred to as a mobile station or a terminal.) may be referred to as user equipment (UE). Note that the terminal device is a type of communication device, and is also referred to as a mobile station or a terminal.

In the present embodiment, the concept of the communication device includes not only a portable mobile device (terminal device) such as a mobile terminal but also a device installed in a structure or a mobile body. The structure or the moving body itself may be regarded as a communication device. Furthermore, the concept of the communication device includes not only a terminal device but also a base station and a relay station. The communication device is a type of processing device and information processing device. Furthermore, the communication device can be rephrased as a transmission device or a reception device.

Hereinafter, a configuration of each device constituting the communication system 1 will be specifically described. Note that the configuration of each device described below is merely an example. The configuration of each device may be different from the following configuration.

2-2. Configuration of Management Device

Next, a configuration of the management device 10 will be described.

The management device 10 is a device that manages a wireless network. For example, the management device 10 is a device that manages communication of the base station 20. The management device 10 may be, for example, a device having a function as a mobility management entity (MME). The management device 10 may be a device having a function as an access and mobility management function (AMF) and/or a session management function (SMF). Of course, the functions of the management device 10 are not limited to the MME, the AMF, and the SMF. The management device 10 may be a device having a function as a network slice selection function (NSSF), an authentication server function (AUSF), a policy control function (PCF), or a unified data management (UDM). Furthermore, the management device 10 may be a device having a function as a home subscriber server (HSS).

Note that the management device 10 may have a function of a gateway. For example, the management device 10 may have a function as a serving gateway (S-GW) or a packet data network gateway (P-GW). Furthermore, the management device 10 may have a function as a user plane function (UPF).

The core network includes a plurality of network functions, and each network function may be aggregated into one physical device or distributed to a plurality of physical devices. That is, the management device 10 can be dispersedly arranged in a plurality of devices. Moreover, this distributed arrangement may be controlled to be executed dynamically. The base station 20 and the management device 10 constitute one network, and provide a wireless communication service to the terminal device 40. The management device 10 is connected to the Internet, and the terminal device 40 can use, via the base station 20, various services provided via the Internet.

Note that the management device 10 is not necessarily a device constituting the core network. For example, it is assumed that the core network is a core network of wideband code division multiple access (W-CDMA) or code division multiple access 2000 (cdma2000). At this time, the management device 10 may be a device that functions as a radio network controller (RNC).

Figure 3:
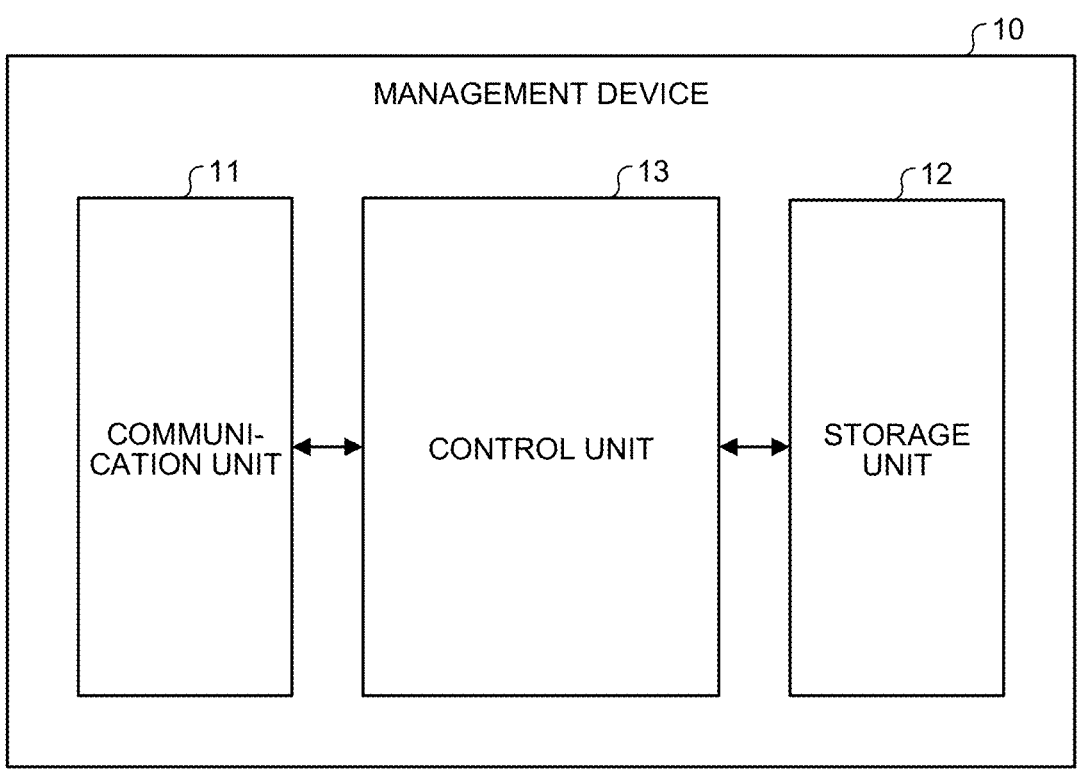
FIG. 3 is a diagram illustrating a configuration example of a management device according to an embodiment of the present disclosure.

FIG. 3 is a diagram illustrating a configuration example of the management device 10 according to the embodiment of the present disclosure. The management device 10 includes a communication unit 11, a storage unit 12, and a control unit 13. Note that the configuration illustrated in FIG. 3 is a functional configuration, and a hardware configuration may be different from the functional configuration. Furthermore, the functions of the management device 10 may be statically or dynamically distributed and implemented in a plurality of physically separated configurations. For example, the management device 10 may include a plurality of server devices.

The communication unit 11 is a communication interface for communicating with other devices. The communication unit 11 may be a network interface or a device connection interface. For example, the communication unit 11 may be a local area network (LAN) interface such as a network interface card (NIC), or may be a universal serial bus (USB) interface including a USB host controller, a USB port, and the like. Furthermore, the communication unit 11 may be a wired interface or a wireless interface. The communication unit 11 functions as a communication means of the management device 10. The communication unit 11 communicates with the base station 20 and the like under the control of the control unit 13.

The storage unit 12 is a data readable/writable storage device such as a dynamic random access memory (DRAM), a static random access memory (SRAM), a flash memory, or a hard disk. The storage unit 12 functions as a storage means of the management device 10. The storage unit 12 stores, for example, a connection state of the terminal device 40. For example, the storage unit 12 stores a radio resource control (RRC) state or an EPS connection management (ECM) state or a 5G system connection management (CM) state of the terminal device 40. The storage unit 12 may function as a home memory that stores position information of the terminal device 40.

The control unit 13 is a controller that controls each unit of the management device 10. The control unit 13 is realized by, for example, a processor such as a central processing unit (CPU), a micro processing unit (MPU), or a graphics processing unit (GPU). For example, the control unit 13 is realized by the processor executing various programs stored in a storage device inside the management device 10 using a random access memory (RAM) or the like as a work area. Note that the control unit 13 may be realized by an integrated circuit such as an application specific integrated circuit (ASIC) or a field programmable gate array (FPGA). Any of the CPU, the MPU, the GPU, the ASIC, and the FPGA can be regarded as a controller.

2-3. Configuration of Base Station

Next, a configuration of the base station 20 will be described.

The base station 20 is a wireless communication device that performs wireless communication with the terminal device 40. The base station 20 may be configured to wirelessly communicate with the terminal device 40 via the relay station 30, or may be configured to directly wirelessly communicate with the terminal device 40.

The base station 20 is a type of communication device. More specifically, the base station 20 is a device corresponding to a wireless base station (Base Station, Node B, eNB, gNB, etc.) or a wireless access point. The base station 20 may be a wireless relay station. Furthermore, the base station 20 may be an optical extension device called a remote radio head (RRH) or a radio unit (RU). Furthermore, the base station 20 may be a receiving station such as a field pickup unit (FPU). Furthermore, the base station 20 may be an integrated access and backhaul (IAB) donor node or an IAB relay node that provides a radio access line and a radio backhaul line by time division multiplexing, frequency division multiplexing, or space division multiplexing.

Note that the radio access technology used by the base station 20 may be a cellular communication technology or a wireless LAN technology. Of course, the radio access technology used by the base station 20 is not limited thereto, and may be another radio access technology. For example, the radio access technology used by the base station 20 may be a low power wide area (LPWA) communication technology. Of course, the radio communication used by the base station 20 may be radio communication using millimeter waves. Furthermore, the radio communication used by the base station 20 may be radio communication using radio waves or radio communication (optical radio) using infrared rays or visible light.

The base station 20 may be capable of non-orthogonal multiple access (NOMA) communication with the terminal device 40. Here, the NOMA communication is communication using a non-orthogonal resource (transmission, reception, or both). Note that the base station 20 may be able to perform NOMA communication with another base station 20.

Note that the base stations 20 may be able to communicate with each other via a base station-core network interface (for example, NG Interface, S1 Interface, and the like). This interface may be either wired or wireless. Furthermore, the base stations may be capable of communicating with each other via an inter-base station interface (for example, Xn Interface, X2 Interface, S1 Interface, F1 Interface, and the like). This interface may be either wired or wireless.

Note that the concept of the base station includes not only a donor base station but also a relay base station (It is also referred to as a relay station.). For example, the relay base station may be any one of RF Repeater, Smart Repeater, and Intelligent Surface. Furthermore, the concept of the base station includes not only a structure having a function of the base station but also a device installed in the structure.

The structure is, for example, a building such as a high-rise building, a house, a steel tower, a station facility, an airport facility, a harbor facility, an office building, a school building, a hospital, a factory, a commercial facility, or a stadium. Note that the concept of the structure includes not only a building but also a construction (non-building structure) such as a tunnel, a bridge, a dam, a wall, or an iron pillar, and equipment such as a crane, a gate, or a windmill. Furthermore, the concept of the structure includes not only a structure on land (on the ground in a narrow sense) or in the ground, but also a structure over water such as a platform or a megafloat, and a structure under water such as a marine observation facility. The base station may be referred to as an information processing device.

The base station 20 may be a donor station or a relay station (relay station). Furthermore, the base station 20 may be a fixed station or a mobile station. The mobile station is a wireless communication device (for example, a base station) configured to be movable. At this time, the base station 20 may be a device installed in a moving body or may be a moving body itself. For example, a relay station having mobility can be regarded as the base station 20 as a mobile station. Furthermore, a device that is originally a device having a mobile capability and has a function of a base station (at least a part of the function of the base station), such as a vehicle, an unmanned aerial vehicle (UAV) typified by a drone, or a smartphone, also corresponds to the base station 20 as a mobile station.

Here, the moving body may be a mobile terminal such as a smartphone or a mobile phone. Furthermore, the moving body may be a moving body (for example, a vehicle such as an automobile, a bicycle, a bus, a truck, a motorcycle, a train, or a linear motor car) that moves on land (on the ground in a narrow sense) or a moving body (for example, the subway) that moves underground (for example, in a tunnel).

Furthermore, the mobile body may be a mobile body (for example, a ship such as a passenger ship, a cargo ship, or a hovercraft) that moves over water or a mobile body (for example, submersibles such as submersible vessels, submarines, and unmanned underwater vehicles) that moves underwater.

Note that the moving body may be a moving body (for example, an aircraft such as an airplane, an airship, or a drone) that moves in the atmosphere.

Furthermore, the base station 20 may be a ground base station (ground station) installed on the ground. For example, the base station 20 may be a base station arranged in a structure on the ground, or may be a base station installed in a mobile body moving on the ground. More specifically, the base station 20 may be an antenna installed in a structure such as a building and a signal processing device connected to the antenna. Of course, the base station 20 may be a structure or a moving body itself. The "ground" is a ground in a broad sense including not only land (ground in a narrow sense) but also underground, above water, and underwater. Note that the base station 20 is not limited to a ground base station. For example, in a case where the communication system 1 is a satellite communication system, the base station 20 may be an aircraft station. From the perspective of a satellite station, an aircraft station located on the earth is a ground station.

Note that the base station 20 is not limited to a ground station. The base station 20 may be a non-ground base station (non-ground station) capable of floating in the air or space. For example, the base station 20 may be an aircraft station or a satellite station.

The satellite station is a satellite station capable of floating outside the atmosphere. The satellite station may be a device mounted on a space mobile body such as an artificial satellite, or may be a space mobile body itself. The space mobile body is a mobile body that moves outside the atmosphere. Examples of the space mobile body include artificial bodies such as artificial satellites, spacecraft, space stations, and probes.

Note that the satellite serving as the satellite station may be any of a low earth orbiting (LEO) satellite, a medium earth orbiting (MEO) satellite, a geostationary earth orbiting (GEO) satellite, and a highly elliptical orbiting (HEO) satellite. Of course, the satellite station may be a device mounted on a low earth orbiting satellite, a middle earth orbiting satellite, a geostationary earth orbiting satellite, or a high elliptical orbiting satellite.

An aircraft station is a wireless communication device capable of floating in the atmosphere, such as an aircraft. The aircraft station may be a device mounted on an aircraft or the like, or may be an aircraft itself. Note that the concept of an aircraft includes not only heavy aircraft such as an airplane and a glider but also light aircraft such as a balloon and an airship. Furthermore, the concept of an aircraft includes not only a heavy aircraft and a light aircraft but also a rotorcraft such as a helicopter and an autogyro. Note that the aircraft station (alternatively, an aircraft on which an aircraft station is mounted) may be an unmanned aerial vehicle such as a drone.

Note that the concept of the unmanned aerial vehicle also includes an unmanned aircraft system (UAS) and a tethered UAS. Furthermore, the concept of unmanned aerial vehicles also includes lighter than air (LTA) UAS and heavier than air (HTA) UAS. Other concepts of unmanned aerial vehicles also include high altitude UAS platforms (HAPs).

A size of the coverage of the base station 20 may be large such as a macro cell or small such as a pico cell. Of course, the size of the coverage of the base station 20 may be extremely small such as a femto cell. Furthermore, the base station 20 may have a beamforming capability. In this case, in the base station 20, a cell or a service area may be formed for each beam.

Figure 4:
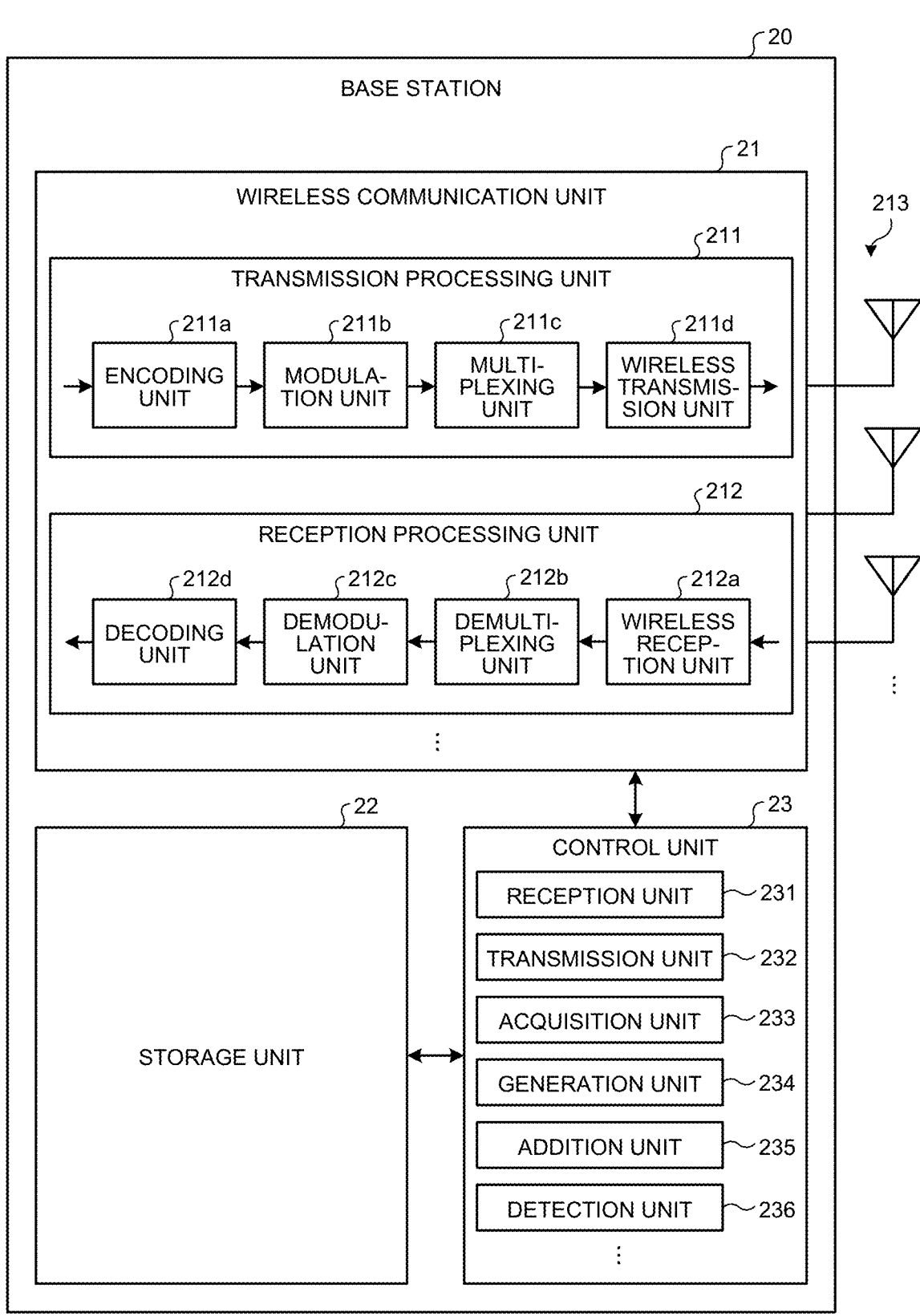
FIG. 4 is a diagram illustrating a configuration example of a base station according to an embodiment of the present disclosure.

FIG. 4 is a diagram illustrating a configuration example of the base station 20 according to the embodiment of the present disclosure. The base station 20 includes a wireless communication unit 21, a storage unit 22, and a control unit 23. Note that the configuration illustrated in FIG. 4 is a functional configuration, and a hardware configuration may be different from the functional configuration. Furthermore, the functions of the base station 20 may be implemented in a distributed manner in a plurality of physically separated configurations.

The wireless communication unit 21 is a signal processing unit for wirelessly communicating with other wireless communication devices (for example, the terminal device 40). The wireless communication unit 21 operates under the control of the control unit 23. The wireless communication unit 21 corresponds to one or a plurality of wireless access methods. For example, the wireless communication unit 21 supports both NR and LTE. The wireless communication unit 21 may be compatible with W-CDMA or cdma2000 in addition to NR or LTE. Furthermore, the wireless communication unit 21 may support an automatic retransmission technology such as hybrid automatic repeat request (HARQ).

The wireless communication unit 21 includes a transmission processing unit 211, a reception processing unit 212, and an antenna 213. The wireless communication unit 21 may include a plurality of the transmission processing units 211, a plurality of the reception processing units 212, and a plurality of the antennas 213. Note that, in a case where the wireless communication unit 21 supports a plurality of wireless access methods, each unit of the wireless communication unit 21 can be configured individually for each wireless access method. For example, the transmission processing unit 211 and the reception processing unit 212 may be individually configured by LTE and NR. Furthermore, the antenna 213 may include a plurality of antenna elements (for example, a plurality of patch antennas). In this case, the wireless communication unit 21 may be configured to be beamformable. The wireless communication unit 21 may be configured to be able to perform polarization beamforming using vertically polarized waves (V-polarized waves) and horizontally polarized waves (H-polarized waves).

The transmission processing unit 211 performs processing of transmitting downlink control information and downlink data. For example, the transmission processing unit 211 encodes the downlink control information and the downlink data input from the control unit 23 using an encoding method such as block encoding, convolutional encoding, turbo encoding, or the like. Here, the encoding may be performed by polar code encoding or low density parity check code (LDPC code) encoding. Then, the transmission processing unit 211 modulates coded bits by a predetermined modulation method such as BPSK, QPSK, 16 QAM, 64 QAM, or 256 QAM. In this case, signal points on constellation do not necessarily have to be equidistant. The constellation may be a non-uniform constellation (NUC). Then, the transmission processing unit 211 multiplexes a modulation symbol of each channel and a downlink reference signal and arranges the multiplexed symbols in a predetermined resource element. Then, the transmission processing unit 211 performs various types of signal processing on the multiplexed signal. For example, the transmission processing unit 211 performs processing such as conversion into a frequency domain by fast Fourier transform, addition of a guard interval (cyclic prefix), generation of a baseband digital signal, conversion into an analog signal, quadrature modulation, up-conversion, removal of an extra frequency component, and amplification of power. The signal generated by the transmission processing unit 211 is transmitted from the antenna 213.

The reception processing unit 212 processes an uplink signal received via the antenna 213. For example, the reception processing unit 212 performs down-conversion, removal of an unnecessary frequency component, control of an amplification level, quadrature demodulation, conversion to a digital signal, removal of a guard interval (cyclic prefix), extraction of a frequency domain signal by fast Fourier transform, and the like on the uplink signal. Then, the reception processing unit 212 separates an uplink channel such as a physical uplink shared channel (PUSCH) and a physical uplink control channel (PUCCH) and an uplink reference signal from the signals subjected to these processing. Furthermore, the reception processing unit 212 demodulates the received signal using a modulation method such as binary phase shift keying (BPSK) or quadrature phase shift keying (QPSK) with respect to a modulation symbol of an uplink channel. A modulation method used for demodulation may be 16 quadrature amplitude modulation (QAM), 64 QAM, or 256 QAM. In this case, signal points on constellation do not necessarily have to be equidistant. The constellation may be a non-uniform constellation (NUC). Then, the reception processing unit 212 performs decoding processing on the demodulated encoded bits of the uplink channel. The decoded uplink data and uplink control information are output to the control unit 23.

The antenna 213 is an antenna device (antenna unit) that mutually converts a current and a radio wave. The antenna 213 may include one antenna element (for example, one patch antenna) or may include a plurality of antenna elements (for example, a plurality of patch antennas). In a case where the antenna 213 includes a plurality of antenna elements, the wireless communication unit 21 may be configured to be beamformable. For example, the wireless communication unit 21 may be configured to generate a directional beam by controlling the directivity of a wireless signal using a plurality of antenna elements. Note that the antenna 213 may be a dual-polarized antenna. In a case where the antenna 213 is a dual-polarized antenna, the wireless communication unit 21 may use vertically polarized waves (V-polarized waves) and horizontally polarized waves (H-polarized waves) in transmitting the wireless signal. Then, the wireless communication unit 21 may control the directivity of the wireless signal transmitted using the vertically polarized waves and the horizontally polarized waves. Furthermore, the wireless communication unit 21 may transmit and receive spatially multiplexed signals via a plurality of layers including the plurality of antenna elements.

The storage unit 22 is a storage device capable of reading and writing data, such as a DRAM, an SRAM, a flash memory, or a hard disk. The storage unit 22 functions as a storage means of the base station 20.

The control unit 23 is a controller that controls each unit of the base station 20. The control unit 23 is realized by, for example, a processor such as a central processing unit (CPU) or a micro processing unit (MPU). For example, the control unit 23 is implemented by a processor executing various programs stored in a storage device inside the base station 20 using a random access memory (RAM) or the like as a work area. Note that the control unit 23 may be realized by an integrated circuit such as an application specific integrated circuit (ASIC) or a field programmable gate array (FPGA). Any of the CPU, the MPU, the ASIC, and the FPGA can be regarded as a controller. Furthermore, the control unit 23 may be realized by a graphics processing unit (GPU) in addition to or instead of the CPU.

The control unit 23 includes a reception unit 231, a transmission unit 232, an acquisition unit 233, a generation unit 234, an addition unit 235, and a detection unit 236. Each block (the reception unit 231 to the detection unit 236) constituting the control unit 23 is a functional block indicating a function of the control unit 23. These functional blocks may be software blocks or hardware blocks. For example, each of the functional blocks described above may be one software module realized by software (including a microprogram), or may be one circuit block on a semiconductor chip (die). Of course, each functional block may be one processor or one integrated circuit. The control unit 23 may be configured by a functional unit different from the above-described functional block. A configuration method of the functional block is arbitrary. Note that the operation of the control unit 23 may be the same as the operation of each block of the control unit of the terminal device 40.

In some embodiments, the concept of a base station may be configured by a collection of a plurality of physical or logical devices. For example, in this embodiment, the base station may be distinguished into a plurality of devices such as a baseband unit (BBU) and a radio unit (RU). Then, the base station may be interpreted as an assembly of the plurality of devices. Furthermore, the base station may be either or both of a BBU and an RU. The BBU and the RU may be connected by a predetermined interface (for example, enhanced common public radio interface (eC-PRI)). Note that the RU may be referred to as a remote radio unit (RRU) or a radio dot (RD). Furthermore, the RU may correspond to a gNB distributed unit (gNB-DU) described later. Moreover, the BBU may correspond to a gNB central unit (gNB-CU) described below. Alternatively, the RU may be a wireless device connected to the gNB-DU described later. The gNB-CU, the gNB-DU, and the RU connected to the gNB-DU may be configured to conform to an open radio access network (O-RAN). Moreover, the RU may be a device integrally formed with the antenna. An antenna (for example, an antenna integrally formed with an RU) included in the base station may adopt an Advanced Antenna System and support MIMO (for example, FD-MIMO) or beamforming. Furthermore, the antenna included in the base station may include, for example, 64 transmission antenna ports and 64 reception antenna ports.

Furthermore, the antenna mounted on the RU may be an antenna panel including one or more antenna elements, and the RU may be mounted with one or more antenna panels. For example, the RU may be mounted with two antenna panels of a horizontally polarized antenna panel and a vertically polarized antenna panel, or two antenna panels of a clockwise circularly polarized antenna panel and a counterclockwise circularly polarized antenna panel. Furthermore, the RU may form and control an independent beam for each antenna panel.

Note that a plurality of the base stations may be connected to each other. The one or the plurality of base stations may be included in a radio access network (RAN). In this case, the base station may be simply referred to as a RAN, a RAN node, an access network (AN), or an AN node. Note that the RAN in LTE is sometimes referred to as an enhanced universal terrestrial RAN (EUTRAN). Furthermore, RAN in NR may be referred to as NGRAN. Furthermore, RAN in W-CDMA (UMTS) is sometimes referred to as UTRAN.

Note that an LTE base station may be referred to as an evolved node B (eNodeB) or an eNB. At this time, the EUTRAN includes one or a plurality of eNodeBs (eNBs). Furthermore, an NR base station may be referred to as a gNodeB or a gNB. At this time, the NGRAN includes one or a plurality of gNBs. The EUTRAN may include a gNB (en-gNB) connected to a core network (EPC) in an LTE communication system (EPS). Similarly, the NGRAN may include an ng-eNB connected to a core network 5GC in a 5G communications system (5GS).

Note that, in a case where the base station is an eNB, a gNB, or the like, the base station may be referred to as 3GPP access. Furthermore, in a case where the base station is a wireless access point, the base station may be referred to as non-3GPP access. Moreover, the base station may be an optical extension device called a remote radio head (RRH) or a radio unit (RU). Furthermore, in a case where the base station is a gNB, the base station may be a combination of the gNB-CU and the qNB-DU described above, or may be any one of the gNB-CU and the gNB-DU.

Here, the gNB-CU hosts a plurality of upper layers (for example, radio resource control (RRC), service data adaptation protocol (SDAP), and packet data convergence protocol (PDCP)) in an access stratum for communication with the UE. On the other hand, the gNB-DU hosts a plurality of lower layers (for example, radio link control (RLC), medium access control (MAC), and physical layer (PHY)) in the access stratum. That is, among messages/information to be described later, RRC signaling (semi-static notification) may be generated by the gNB-CU, while MAC CE and DCI (dynamic notification) may be generated by the gNB-DU. Alternatively, among the RRC configurations (semi-static notification), for example, some configurations such as IE: cellGroupConfig may be generated by the gNB-DU, and the remaining configurations may be generated by the gNB-CU. These configurations may be transmitted and received through an F1 interface described later.

Note that the base station may be configured to be able to communicate with another base station. For example, in a case where a plurality of the base stations are eNBs or a combination of an eNB and an en-gNB, the base stations may be connected by an X2 interface. Furthermore, in a case where the plurality of base stations are gNBs or a combination of a gn-eNB and a gNB, the devices may be connected by an Xn interface. Furthermore, in a case where the plurality of base stations are a combination of the gNB-CU and the gNB-DU, the devices may be connected by the above-described F1 interface. A message/information (for example, RRC signaling, MAC control element (MAC CE), or DCI) to be described later may be transmitted between the plurality of base stations, for example, via an X2 interface, an Xn interface, or an F1 interface.

A cell provided by the base station may be referred to as a serving cell. The concept of the serving cell includes a primary cell (PCell) and a secondary cell (SCell). In a case where dual connectivity is configured for the UE (for example, the terminal device 40), the PCell provided by a master node (MN) and zero or one or more SCells may be referred to as master cell group. Examples of the dual connectivity include EUTRA-EUTRA Dual Connectivity, EUTRA-NR dual connectivity (ENDC), EUTRA-NR Dual Connectivity with 5GC, NR-EUTRA dual connectivity (NEDC), and NR-NR Dual Connectivity.

Note that the serving cell may include a primary secondary cell or primary SCG cell (PSCell). In a case where the dual connectivity is configured for the UE, the PSCell provided by a secondary node (SN) and zero or one or more SCells may be referred to as secondary cell group (SCG). Unless specially configured (for example, PUCCH on SCell), a physical uplink control channel (PUCCH) is transmitted in the PCell and the PSCell, but is not transmitted in the SCell. Furthermore, a radio link failure is also detected in the PCell and the PSCell, but is not detected in the SCell (may not be detected). As described above, since the PCell and the PSCell have a special role in the serving cell, they are also referred to as special cell (SpCell).

One downlink component carrier and one uplink component carrier may be associated with one cell. Furthermore, a system bandwidth corresponding to one cell may be divided into a plurality of bandwidth parts (BWPs). In this case, the one or the plurality of BWPs may be configured for the UE, and one BWP may be used for the UE as an active BWP. Furthermore, radio resources (for example, a frequency band, a numerology (subcarrier spacing), and a slot configuration) that can be used by the terminal device 40 may be different for each cell, each component carrier, or each BWP.

2-4. Configuration of Relay Station

Next, a configuration of the relay station 30 will be described.

The relay station 30 is a device serving as a relay station of the base station. The relay station 30 is a type of base station. Furthermore, the relay station 30 is a type of information processing device. The relay station may be referred to as a relay base station. Furthermore, the relay station 30 may be a device called a repeater (e. g., RF Repeater, Smart Repeater, Intelligent Surface).

The relay station 30 can perform wireless communication such as NOMA communication with the terminal device 40. The relay station 30 relays communication between the base station 20 and the terminal device 40. Note that the relay station 30 may be configured to be able to wirelessly communicate with another relay station 30 and the base station 20. The relay station 30 may be a ground station device or a non-ground station device. The relay station 30 constitutes a radio access network RAN together with the base station 20.

Note that the relay station of the present embodiment may be a fixed device, a movable device, or a floating device. Furthermore, a size of the coverage of the relay station of the present embodiment is not limited to a specific size. For example, the cell covered by the relay station may be a macro cell, a micro cell, or a small cell.

Furthermore, the relay station of the present embodiment is not limited to a mounted device as long as the function of relay is satisfied. For example, the relay may be mounted on a terminal device such as a smartphone, may be mounted on an automobile, a train, or a human-powered vehicle, may be mounted on a balloon, an airplane, or a drone, may be mounted on a traffic light, a sign, a street light, or the like, or may be mounted on a home appliance such as a television, a game machine, an air conditioner, a refrigerator, or a lighting fixture.

In addition, the configuration of the relay station 30 may be similar to the configuration of the base station 20 described above. For example, similarly to the base station 20 described above, the relay station 30 may be a device installed in a mobile body or may be a mobile body itself. As described above, the mobile body may be a mobile terminal such as a smartphone or a mobile phone. Furthermore, the moving body may be a moving body that moves on land (on the ground in a narrow sense) or may be a moving body that moves underground. Of course, the moving body may be a moving body that moves over water or may be a moving body that moves underwater. In addition, the moving body may be a moving body that moves inside the atmosphere or may be a moving body that moves outside the atmosphere. Furthermore, the relay station 30 may be a ground station device or a non-ground station device. At this time, the relay station 30 may be an aircraft station or a satellite station.

Furthermore, the size of the coverage of the relay station 30 may be large such as a macro cell or small such as a pico cell, similarly to the base station 20. Of course, the size of the coverage of the relay station 30 may be extremely small such as a femto cell. Furthermore, the relay station 30 may have a beamforming capability. In this case, in the relay station 30, a cell or a service area may be formed for each beam.

Figure 5:
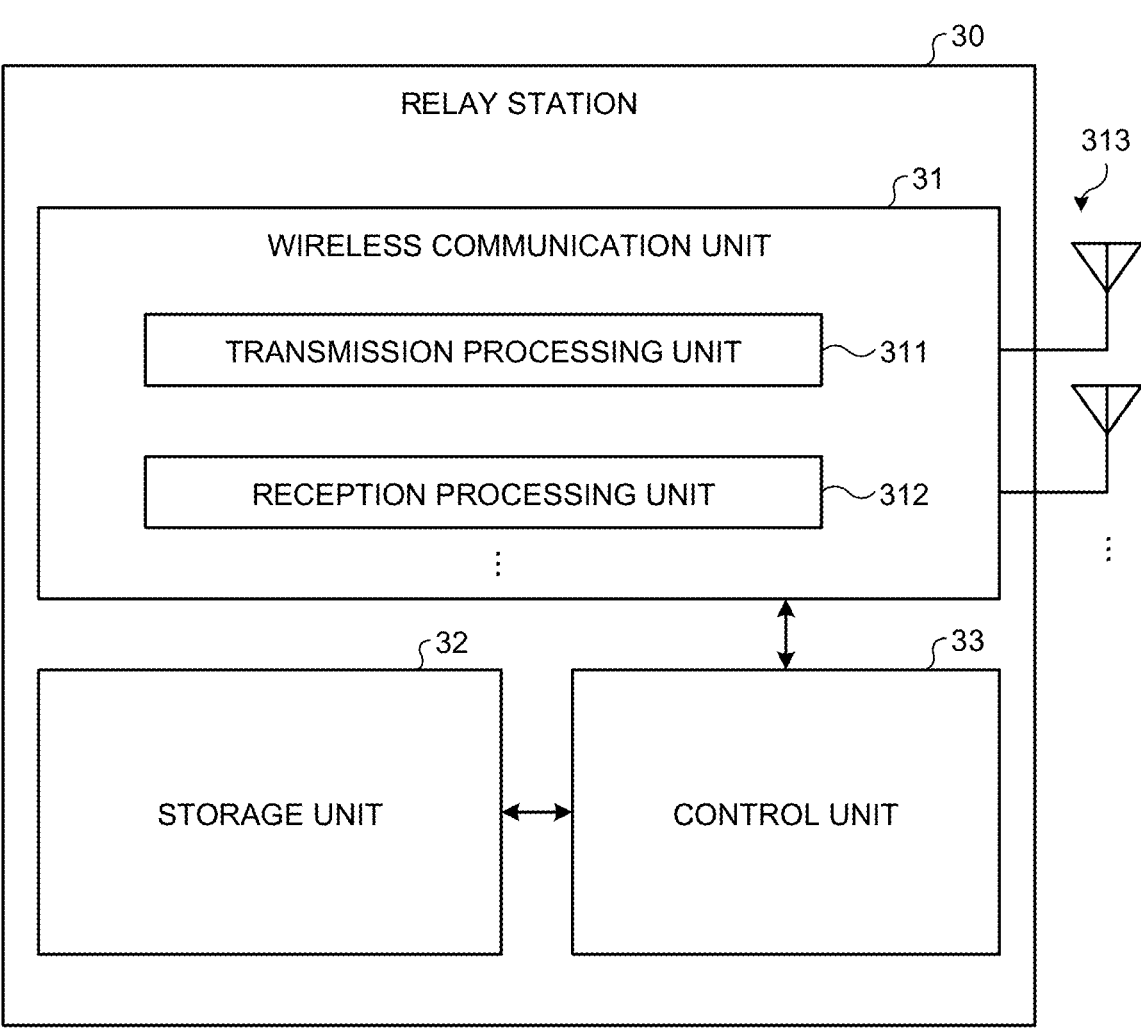
FIG. 5 is a diagram illustrating a configuration example of a relay station according to an embodiment of the present disclosure.

FIG. 5 is a diagram illustrating a configuration example of the relay station 30 according to the embodiment of the present disclosure. The relay station 30 includes a wireless communication unit 31, a storage unit 32, and a control unit 33. Note that the configuration illustrated in FIG. 5 is a functional configuration, and a hardware configuration may be different from the functional configuration. Furthermore, the functions of the relay station 30 may be implemented in a distributed manner in a plurality of physically separated configurations.

The wireless communication unit 31 is a wireless communication interface that wirelessly communicates with other wireless communication devices (for example, the base station 20, the terminal device 40, and another relay station 30). The wireless communication unit 31 corresponds to one or a plurality of wireless access methods. For example, the wireless communication unit 31 supports both NR and LTE. The wireless communication unit 31 may be compatible with W-CDMA or cdma2000 in addition to NR or LTE. The wireless communication unit 31 includes a transmission processing unit 311, a reception processing unit 312, and an antenna 313. The wireless communication unit 31 may include a plurality of the transmission processing units 311, a plurality of the reception processing units 312, and a plurality of the antennas 313. Note that, in a case where the wireless communication unit 31 supports a plurality of wireless access methods, each unit of the wireless communication unit 31 can be configured individually for each wireless access method. For example, the transmission processing unit 311 and the reception processing unit 312 may be individually configured by LTE and NR. The configurations of the transmission processing unit 311, the reception processing unit 312, and the antenna 313 are similar to the configurations of the transmission processing unit 211, the reception processing unit 212, and the antenna 213 described above. Note that the wireless communication unit 31 may be configured to be beamformable similarly to the wireless communication unit 21.

The storage unit 32 is a storage device capable of reading and writing data, such as a DRAM, an SRAM, a flash memory, or a hard disk. The storage unit 32 functions as a storage means of the relay station 30.

The control unit 33 is a controller that controls each unit of the relay station 30. The control unit 33 is realized by, for example, a processor such as a CPU, an MPU, or a GPU. For example, the control unit 33 is implemented by a processor executing various programs stored in a storage device inside the relay station 30 using a RAM or the like as a work area. Note that the control unit 33 may be realized by an integrated circuit such as an ASIC or an FPGA. Any of the CPU, the MPU, the GPU, the ASIC, and the FPGA can be regarded as a controller. The operation of the control unit 33 may be the same as the operation of each block (the reception unit 231 to the detection unit 236) of the control unit 23 of the base station 20.

Note that the relay station 30 may be an IAB relay node. The relay station 30 operates as an IAB-mobile termination (MT) for an IAB donor node that provides backhaul, and operates as an IAB-distributed unit (DU) for the terminal device 40 that provides access. The IAB donor node may be, for example, the base station 20, and operates as an IAB-central unit (CU).

2-5. Configuration of Terminal Device

Next, a configuration of the terminal device 40 will be described.

The terminal device 40 is a wireless communication device that wirelessly communicates with other communication devices such as the base station 20 and the relay station 30. The terminal device 40 is, for example, a mobile phone, a smart device (smartphone or tablet), a personal digital assistant (PDA), or a personal computer. Furthermore, the terminal device 40 may be a device such as a business camera provided with a communication function, or may be a motorcycle, a moving relay vehicle, or the like on which communication equipment such as a field pickup unit (FPU) is mounted. Furthermore, the terminal device 40 may be a machine to machine (M2M) device or an Internet of things (IoT) device.

Note that the terminal device 40 may be able to perform NOMA communication with the base station 20. Furthermore, the terminal device 40 may be able to use an automatic retransmission technology such as HARQ when communicating with the base station 20. The terminal device 40 may be capable of sidelink communication with another terminal device 40. The terminal device 40 may also be able to use an automatic retransmission technology such as HARQ when performing sidelink communication. Note that the terminal device 40 may also be capable of NOMA communication in communication (sidelink) with other terminal devices 40. Furthermore, the terminal device 40 may be able to perform LPWA communication with other communication devices (for example, the base station 20 and other terminal devices 40). Furthermore, the wireless communication used by the terminal device 40 may be wireless communication using millimeter waves. Note that the wireless communication (sidelink communication) used by the terminal device 40 may be wireless communication using radio waves or wireless communication (optical wireless) using infrared rays or visible light.

Furthermore, the terminal device 40 may be a mobile device. The mobile device is a mobile wireless communication device. At this time, the terminal device 40 may be a wireless communication device installed in a mobile body or may be a mobile body itself. For example, the terminal device 40 may be a vehicle that moves on a road such as an automobile, a bus, a truck, or a motorcycle, a vehicle that moves on a rail installed on a track such as a train, or a wireless communication device mounted on the vehicle. Note that the moving body may be a mobile terminal, or may be a moving body that moves on land (on the ground in a narrow sense), underground, above water, or underwater. Furthermore, the moving body may be a moving body that moves inside the atmosphere, such as a drone or a helicopter, or may be a moving body that moves outside the atmosphere, such as an artificial satellite.

The terminal device 40 may be simultaneously connected to a plurality of base stations or a plurality of cells to perform communication. For example, in a case where one base station supports a communication area via a plurality of cells (for example, pCell, sCell), the plurality of cells can be bundled and communicated between the base station 20 and the terminal device 40 by a carrier aggregation (CA) technology, a dual connectivity (DC) technology, or a multi-connectivity (MC) technology. Alternatively, the terminal device 40 and the plurality of base stations 20 can communicate with each other by a coordinated transmission and reception (coordinated multi-point transmission and reception (COMP)) technology via cells of the different base stations 20.

Figure 6:
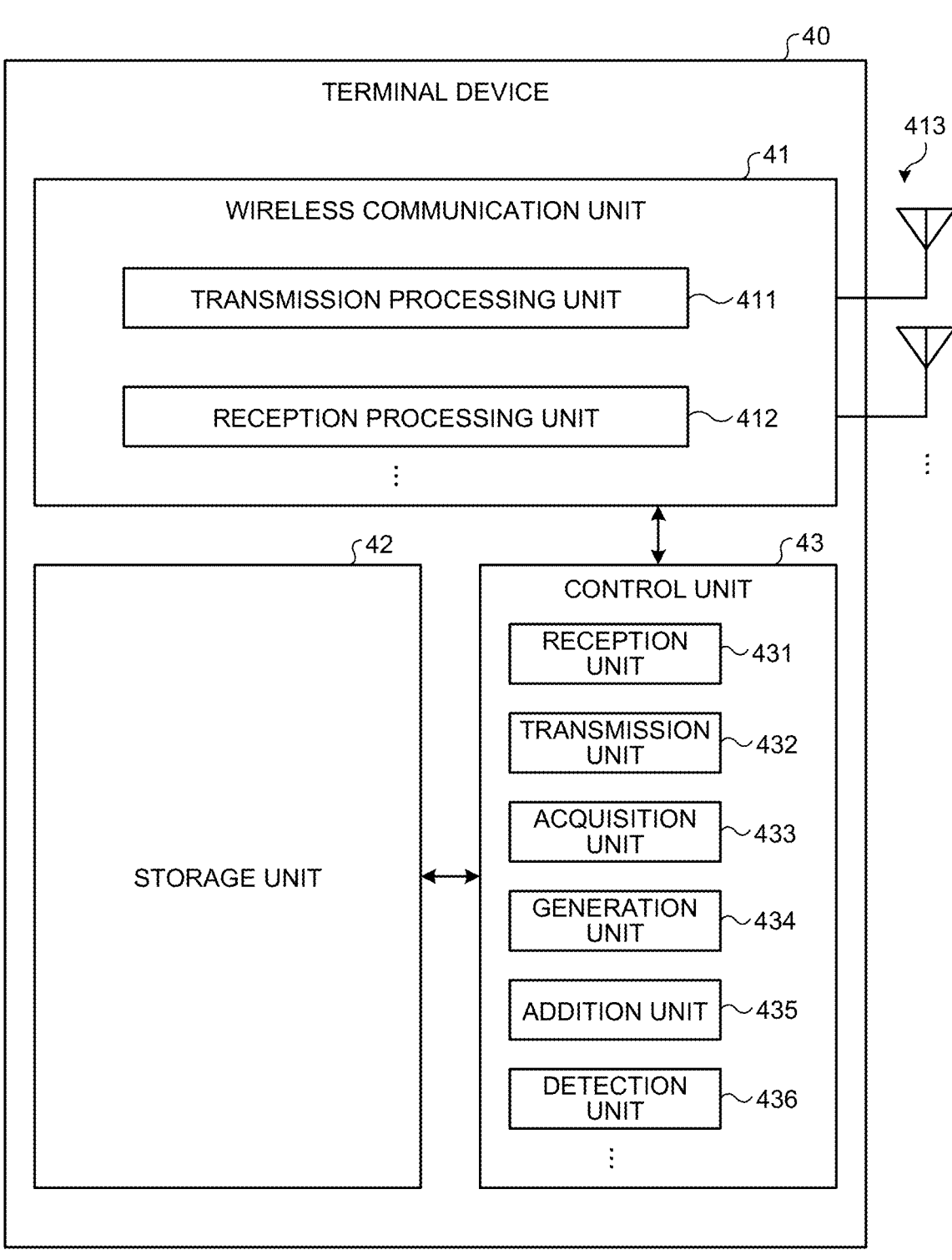
FIG. 6 is a diagram illustrating a configuration example of a terminal device according to an embodiment of the present disclosure.

FIG. 6 is a diagram illustrating a configuration example of the terminal device 40 according to the embodiment of the present disclosure. The terminal device 40 includes a wireless communication unit 41, a storage unit 42, and a control unit 43. Note that the configuration illustrated in FIG. 6 is a functional configuration, and a hardware configuration may be different from the functional configuration. Furthermore, the functions of the terminal device 40 may be implemented in a distributed manner in a plurality of physically separated configurations.

The wireless communication unit 41 is a signal processing unit for wirelessly communicating with other wireless communication devices (for example, the base station 20, the relay station 30, and another terminal device 40). The wireless communication unit 41 operates under the control of the control unit 43. The wireless communication unit 41 includes a transmission processing unit 411, a reception processing unit 412, and an antenna 413. The configurations of the wireless communication unit 41, the transmission processing unit 411, the reception processing unit 412, and the antenna 413 may be similar to those of the wireless communication unit 21, the transmission processing unit 211, the reception processing unit 212, and the antenna 213 of the base station 20. Furthermore, the wireless communication unit 41 may be configured to be beamformable similarly to the wireless communication unit 21. Moreover, similarly to the wireless communication unit 21, the wireless communication unit 41 may be configured to be able to transmit and receive spatially multiplexed signals.

The storage unit 42 is a storage device capable of reading and writing data, such as a DRAM, an SRAM, a flash memory, or a hard disk. The storage unit 42 functions as a storage means of the terminal device 40.

The control unit 43 is a controller that controls each unit of the terminal device 40. The control unit 43 is realized by, for example, a processor such as a CPU or an MPU. For example, the control unit 43 is realized by a processor executing various programs stored in a storage device inside the terminal device 40 using a RAM or the like as a work area. Note that the control unit 43 may be realized by an integrated circuit such as an ASIC or an FPGA. Any of the CPU, the MPU, the ASIC, and the FPGA can be regarded as a controller. Furthermore, the control unit 43 may be realized by a GPU in addition to or instead of the CPU.

The control unit 43 includes a reception unit 431, a transmission unit 432, an acquisition unit 433, a generation unit 434, an addition unit 435, and a detection unit 436. Each block (the reception unit 431 to the detection unit 436) constituting the control unit 43 is a functional block indicating a function of the control unit 43. These functional blocks may be software blocks or hardware blocks. For example, each of the functional blocks described above may be one software module realized by software (including a microprogram), or may be one circuit block on a semiconductor chip (die). Of course, each functional block may be one processor or one integrated circuit. The control unit 43 may be configured by a functional unit different from the above-described functional block. A configuration method of the functional block is arbitrary. The operation of the control unit 43 may be the same as the operation of each block of the control unit 23 of the base station 20.

3. Operation of Communication System

The configuration of the communication system 1 of the present embodiment has been described above. Next, signal processing of the present embodiment will be described.

3-1. Outline of Operation of Communication System

First, an outline of an operation of the communication system 1 will be described.

3-1-1. Outline of Signal Processing

Figure 7:
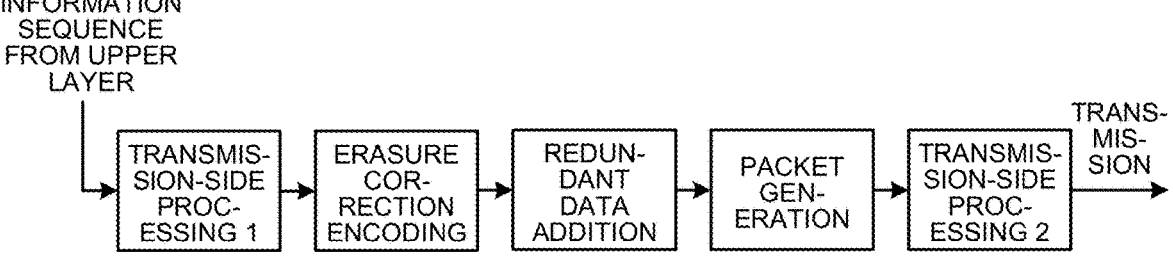
FIG. 7 is a diagram illustrating an outline of signal processing of a communication device on a transmission side.
Figure 8:
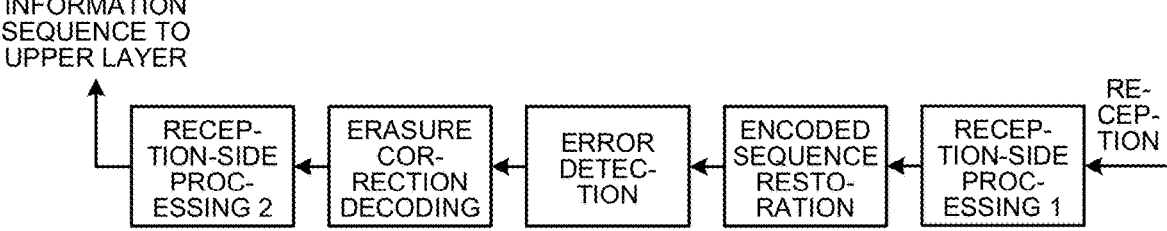
FIG. 8 is a diagram illustrating an outline of signal processing of a communication device on a reception side.

FIGS. 7 and 8 are diagrams illustrating an outline of signal processing of the present embodiment. FIG. 7 is a diagram illustrating an outline of signal processing of the communication device on a transmission side, and FIG. 8 is a diagram illustrating an outline of signal processing of the communication device on a reception side. Each of the base station 20, the relay station 30, and the terminal device 40 can be a communication device on the transmission side or the reception side. In the present embodiment, the communication device executes, for an information sequence to be transmitted and received, encoding processing and decoding processing by an erasure correction encoding method, processing of adding redundant data to a sequence encoded by the erasure correction encoding method, and processing of generating a packet from one or a plurality of encoded sequences.

First, an outline of signal processing on the transmission side will be described with reference to FIG. 7. When acquiring an information sequence from an upper layer (for example, an SDAP layer or an RRC layer), a predetermined layer related to the signal processing inside the communication device performs predetermined signal processing (transmission-side processing 1 illustrated in FIG. 7), and transmits the information sequence (Hereinafter, the information sequence is also referred to as a transmission data sequence.) to an encoding layer (for example, a PDCP layer). The encoding layer performs erasure correction encoding processing on the received transmission data sequence. Thereafter, the communication device adds redundant data to one or a plurality of encoded sequences. The redundant data includes error detection data (for example, a value of CRC) for error detection. At this time, the length varies depending on the error detection data and a predetermined condition. For example, the error detection data has a length corresponding to a length of the one or the plurality of encoded sequences. Alternatively, the error detection data has a different length according to an error rate estimated when the one or the plurality of encoded sequences are transmitted to the communication device on the reception side. The one or the plurality of encoded sequences are stored in a packet together with redundant data, and are transmitted to the communication device on the reception side after undergoing predetermined signal processing (transmission-side processing 2 illustrated in FIG. 7). At least a part of the above processing may be omitted, or the above processing may be performed across a plurality of devices.

Next, an outline of signal processing on the reception side will be described with reference to FIG. 8. When a packet is acquired from a communication device on the transmission side, a predetermined layer related to signal processing inside the communication device performs predetermined signal processing (reception-side processing 1 illustrated in FIG. 8) and transmits the packet to a decoding layer (for example, a PDCP layer). The decoding layer extracts the one or the plurality of encoded sequences from the packet, and performs error detection of the one or the plurality of encoded sequences by using error detection data included in the redundant data. Then, the communication device performs erasure correction encoding processing on the one or the plurality of encoded sequences. An information sequence generated by the erasure correction encoding processing is transmitted to the upper layer after undergoing predetermined signal processing (reception-side processing 2 illustrated in FIG. 8). At least a part of the above processing may be omitted, or the above processing may be performed across a plurality of devices.

The communication device according to the present embodiment generates error detection data having different lengths according to a predetermined condition. As a result, the communication device according to the present embodiment can add redundant data of an appropriate length to the encoded sequence, and thus, can realize high frequency utilization efficiency.

3-1-2. Encoding Processing

The erasure correction encoding processing will be described below. Note that, since the erasure correction decoding processing is processing corresponding to the erasure correction encoding processing, the description thereof will be omitted.

In the erasure correction encoding processing, a plurality of bit sequences is generated from one bit sequence. Here, one bit sequence to be an input to the erasure correction encoding processing corresponds to the above-described transmission data sequence. Note that, in the erasure correction encoding processing, the communication device may divide the plurality of output bit sequences into one or a plurality of first bit sequences that need to be transmitted and one or a plurality of second bit sequences that can be decoded without being transmitted. Then, the communication device may set a plurality of bit sequences that output the one or the plurality of first bit sequences and one or a plurality of third bit sequences selected from among the one or the plurality of second bit sequences.

Figure 9:
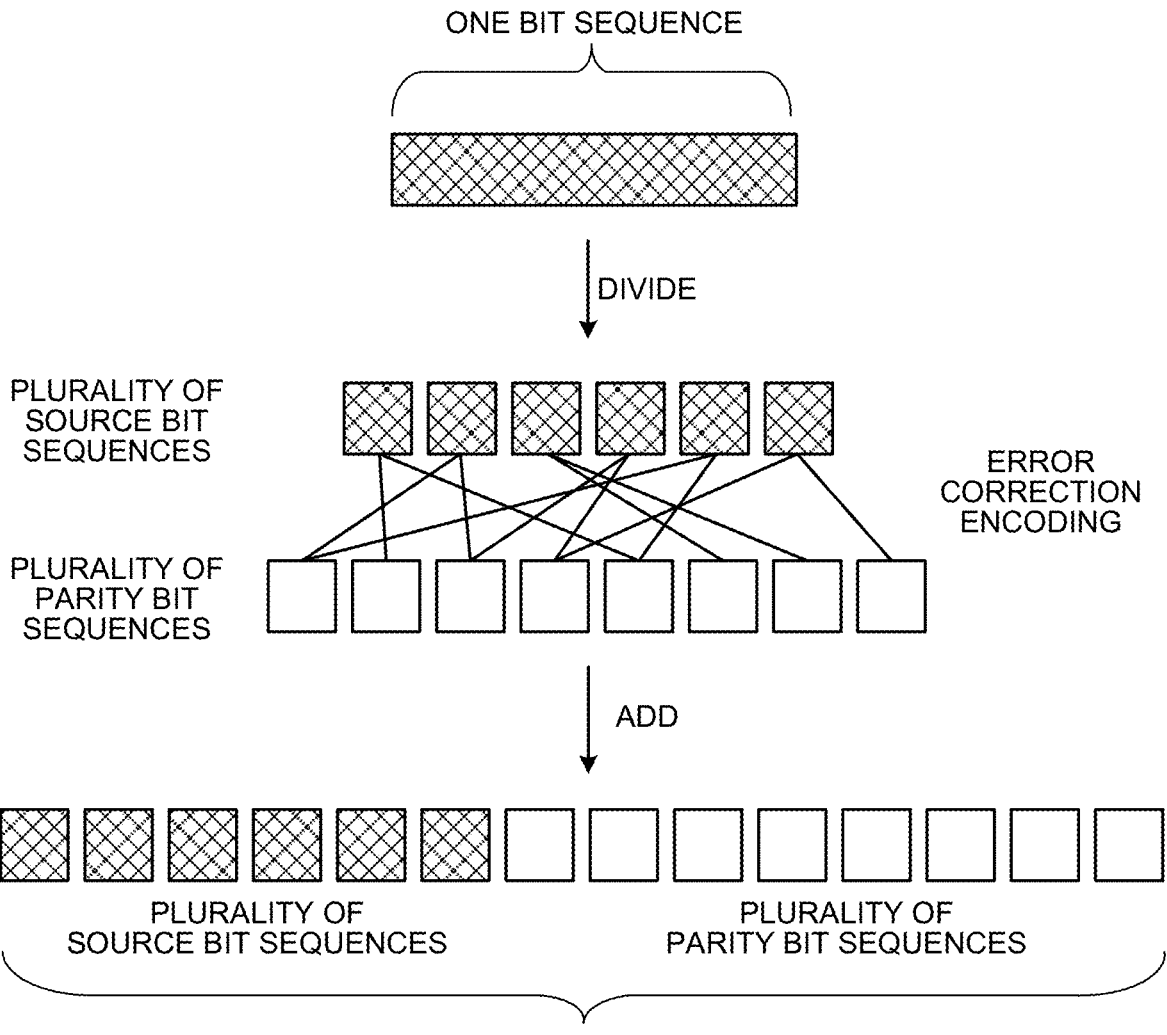
FIG. 9 is a diagram illustrating an example of erasure correction encoding processing.

In the erasure correction encoding processing, processing using a predetermined error correction encoding method is performed. FIG. 9 is a diagram illustrating an example of the erasure correction encoding processing. First, the communication device divides one bit sequence (one source bit sequence) into a plurality of source bit sequences. Then, the communication device generates a plurality of parity bit sequences by performing error correction encoding processing on the plurality of source bit sequences. For example, the communication device generates a plurality of parity bit sequences by sequentially executing the error correction encoding processing on a plurality of bit sequences each obtained by combining two source bit sequences. Then, the communication device generates a plurality of bit sequences to be output by adding the plurality of parity bit sequences to the plurality of source bit sequences. Note that the parity bit sequences added to the plurality of source bit sequences are not necessarily all the generated parity bit sequences. The communication device may add one or a plurality of parity bit sequences selected from among the plurality of parity bit sequences to the plurality of source bit sequences.

Figure 11:
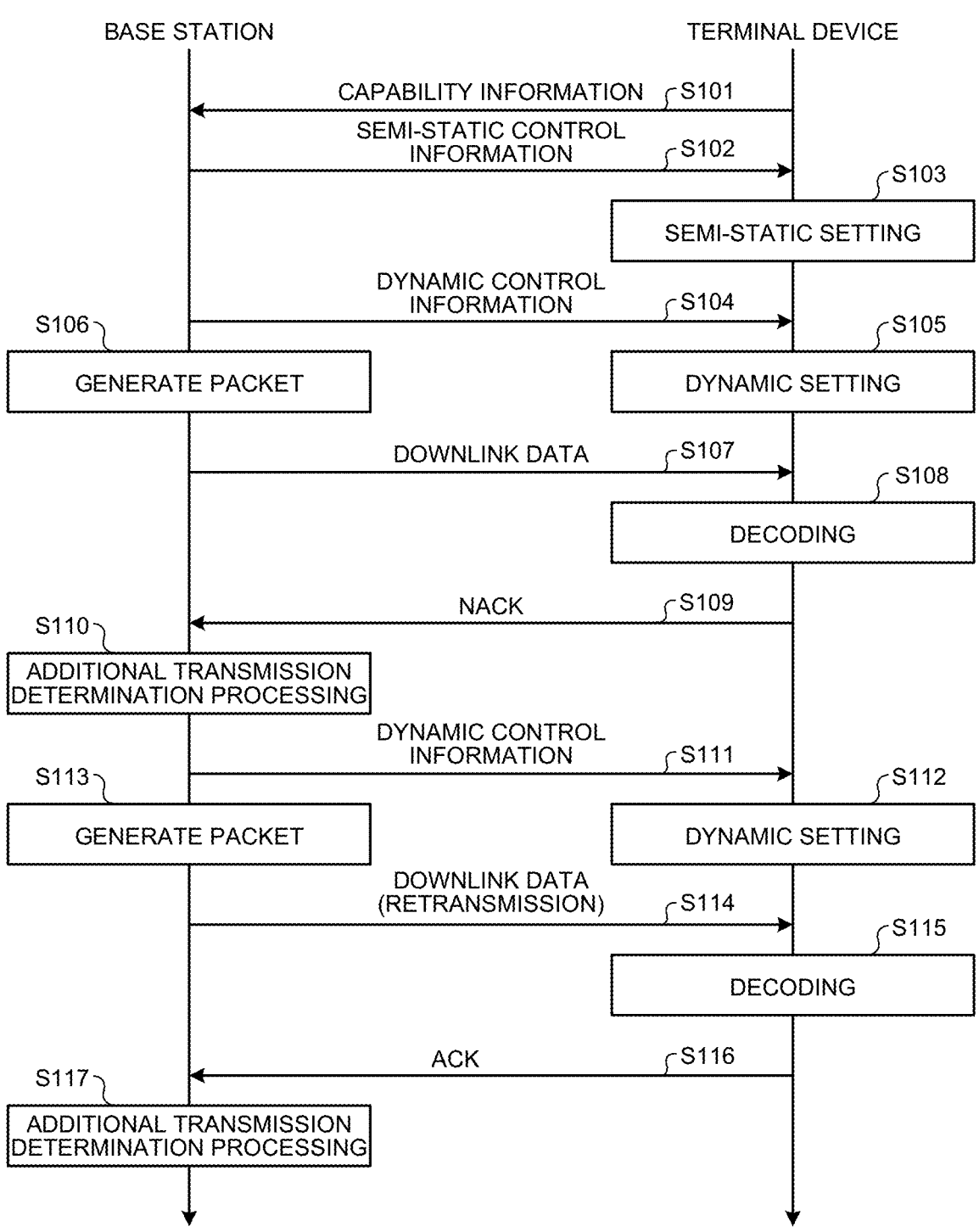
FIG. 11 is a diagram illustrating an exemplary sequence of communication processing according to the present embodiment.

Note that the example illustrated in FIG. 11 is merely an example, and the erasure correction encoding processing is not limited to the example illustrated in FIG. 11. For example, the error correction encoding method may be an error correction encoding method in which not only a parity bit sequence but also an encoded bit sequence is output in a case where a predetermined bit sequence is input.

Note that, the error correction encoding method used in the present embodiment is not limited to the erasure correction codes (Erasure Codes), but may be an error correction encoding method included in a category such as rateless codes or fountain codes. Alternatively, the error correction encoding method used in the present embodiment may be an error correction encoding method in which a plurality of bit sequences is linearly combined or XOR-combined and encoded.

Hereinafter, examples of the error correction encoding method assumed to be used in the present embodiment will be described in (A1) to (A7) below. Of course, the error correction encoding method used in the present embodiment is not limited to the following example.

(A1) Rateless codes
(A2) Fountain codes
(A3) Tornado codes
(A4) Luby transform (LT) codes
(A5) Raptor codes
(A6) RaptorQ codes
(A7) Reed solomon (RS) codes

3-1-3. Redundant Data

Next, the redundant data added to the one or the plurality of encoded sequences will be described.

Figure 10:
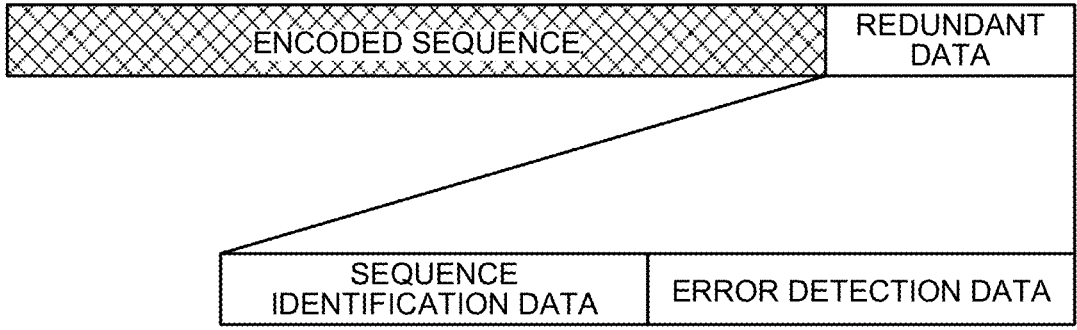
FIG. 10 is a diagram illustrating an example of redundant data to be added to an encoded sequence.

FIG. 10 is a diagram illustrating an example of redundant data to be added to the encoded sequence. The communication device adds, to the encoded sequence generated by the erasure correction code, to the encoded sequence in the form of sequence identification data for symbol identification, error detection data for error detection, and redundant data. The redundant data may be added for each encoded sequence or may be added for a plurality of the encoded sequences.

In FIG. 10, for example, an identification number for identifying the encoded sequence is stored in the sequence identification data. Here, the identification number may be referred to as identification (ID) or sequence number (SN). The identification number is data for the communication device on the reception side to determine which encoded sequence on the transmission side the received encoded sequence corresponds to. The error detection data is a bit for error detection generated on the basis of the encoded sequence by the communication device on the transmission side. When generating the bit for error detection, further encoding processing may be performed on the encoded sequence (for example, CRC).

3-1-4. Procedure Example Related to Encoding

Next, a procedure example related to the encoding of the present embodiment will be described. FIG. 11 is a sequence diagram illustrating a procedure example related to the erasure correction encoding. Note that the procedure example illustrated in FIG. 11 is merely an example, and the present embodiment is not limited to this procedure example. Furthermore, although FIG. 11 illustrates downlink communication from the base station 20 to the terminal device 40, the technique disclosed in the present embodiment is also applicable to other communications (for example, uplink communication from the terminal device 40 to the base station 20). Hereinafter, a procedure example related to the encoding of the present embodiment will be described with reference to a sequence diagram of FIG. 11.

First, the terminal device 40 notifies the base station 20 of the cell to which it is connected of information regarding its own terminal capability (Step S101). This information, this information also includes capability information related to the erasure correction encoding. The terminal device 40 may notify the information regarding the terminal capability during a procedure of initial connection (Initial Access) or after the initial connection. Note that, as the physical channel for this notification, for example, at least one of a physical random access channel (PRACH), a physical uplink control channel (PUCCH), and a physical uplink shared channel (PUSCH) may be used.

The base station 20 notifies the terminal device 40 connected to the cell managed by the base station itself of semi-static control information including information regarding the erasure correction encoding (or the erasure correction decoding) (Step S102). This semi-static control information may be cell-specific control information. The base station 20 may notify the semi-static control information during the procedure of the initial connection or after the initial connection. Furthermore, the base station 20 may notify this control information as part of an RRC procedure such as RRC signaling, RRC configuration, or RRC reconfiguration. Furthermore, the base station 20 may periodically notify the terminal device 40 of the control information. At least one of a broadcast channel (physical broadcast channel (PBCH)), a downlink control channel (physical downlink control channel, enhanced physical downlink control channel (EPDCCH)), and a downlink shared channel (physical downlink shared channel) may be used as a physical channel for notifying the control information.

When the semi-static control information is received, the terminal device 40 performs setting related to the erasure correction encoding (or erasure correction decoding) based on the information regarding the erasure correction encoding (or the erasure correction decoding) included in the received control information (Step S103).

Thereafter, when downlink communication occurs from the base station 20 to the terminal device 40, the base station 20 transmits dynamic control information to the terminal device 40. Examples of a case where downlink communication occurs include a case where the terminal device 40 requests data download (pull) and a case where push data occurs to the terminal device 40. The dynamic control information may be terminal-specific (UE-specific) control information or terminal-group-specific (UE-group-specific) control information. Here, the terminal group is, for example, a group of one or more terminal devices 40 which are transmission destination targets in a case where the downlink communication is multicast or broadcast.

Note that the dynamic control information can include various types of information such as information regarding a radio resource used to perform downlink communication. For example, the dynamic control information can include, for example, information regarding various resources for allocating downlink communication to the target terminal device 40 (terminal device 40 group). More specifically, the dynamic control information can include, for example, the following information (1) to (8).

(1) Frequency resource (for example, a resource block, a subcarrier, a subcarrier group, or the like.)
  (2) Time resource (for example, a subframe, a slot, a mini-slot, a symbol, or the like.)
  (3) Spatial resource (for example, an antenna, an antenna port, a spatial layer, a spatial stream, or the like.)
  (4) Non-orthogonal resources (for example, resources related to power, an interleave pattern, a scrambling pattern, a diffusion pattern, and the like.) for a predetermined communication (for example, non-orthogonal multiple access (NOMA), multiuser superposition transmission (MUST), interleave division multiple access (IDMA), code division multiple access (CDMA), and the like.)
  (5) Information regarding a modulation level (Modulation Order) and a code rate of second encoding (for example, modulation and coding set (MCS) or the like)
  (6) Erasure correction encoding method
  (7) Information regarding a code rate of the erasure correction encoding
  (8) Setting related to ARQ/HARQ (for example, new data indicator (NDI), redundancy version (RV), and the like)

The terminal device 40 that has received the dynamic control information performs setting for preparing for appropriate reception of downlink communication according to the control information (Step S105).

Next, the base station 20 encodes the data of the downlink communication to the terminal device 40 according to the erasure correction encoding method and adds redundant data to the encoded sequence so as to match the control information notified to the terminal device 40. Then, the base station 20 generates a packet having a size based on the resource information from the one or the plurality of encoded sequences to which the redundant data is added (Step S106). The base station 20 transmits the generated packet to the terminal device 40 (Step S107).

When receiving the data from the base station 20, the terminal device 40 executes various processing (reception processing, demodulation processing, and decoding processing) including the erasure correction decoding processing according to the setting specified in the control information (Step S108). For example, the terminal device 40 restores one or more encoded sequences from the received packet. Thereafter, the terminal device 40 determines whether the restored encoded sequence includes an error. Then, the terminal device 40 attempts decoding using only the encoded sequence including no error. Then, the terminal device 40 returns ACK or NACK to the base station 20 depending on whether the data decoding is successful or failed. Furthermore, the terminal device 40 desirably changes the setting of the processing related to the additional transmission depending on whether the data decoding is successful or failed. For example, when the decoding fails, it is desirable that the terminal device 40 stores the decoding result or the data in the middle of decoding (encoded sequence or the like) in the memory in order to perform retransmission and synthesis including the next received encoded sequence. In the example of FIG. 11, the terminal device 40 returns NACK to the base station 20 (Step S109).

The base station 20 executes additional transmission determination processing on the basis of the response (ACK/NACK) received from the terminal device 40 (Step S110). Here, in a case where the notification of NACK is received, the base station 20 performs preparation for transmission of an additional information sequence. Examples of the preparation for retransmission include addition of redundancy for each encoded sequence, packetization based on a notified resource amount of one or a plurality of encoded sequences, and selection of a radio resource. Note that, in a case where the ACK is received from the terminal device 40, it means that transmission and reception of the target data can be performed without any problem, and thus, the process shifts to communication of next new data.

The base station 20 proceeds to perform retransmission or downlink communication of new data according to processing for additional transmission corresponding to the above response (ACK/NACK). For this purpose, the base station 20 notifies the target terminal device 40 of the dynamic control information again, and executes the downlink communication according to the setting.

Figure 13:
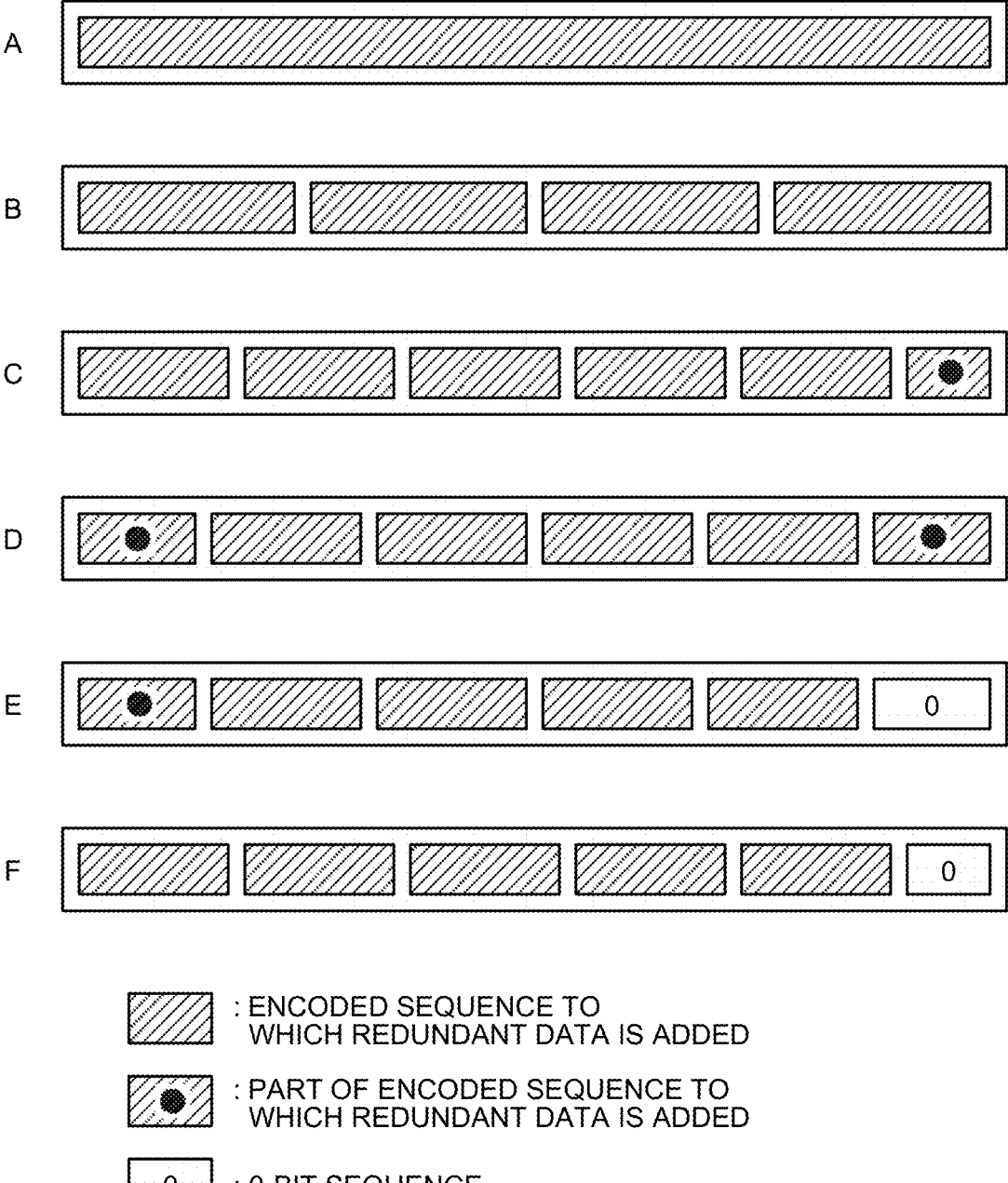
FIG. 13 is a diagram illustrating a configuration of a packet.

In the example of FIG. 13, since NACK is received from the terminal device 40 (Step S109), the base station 20 executes processing for transmitting an additional information sequence (Step S110) and notifies the terminal device 40 of dynamic control information again (Step S111). The terminal device 40 that has received the dynamic control information performs setting for preparing for appropriate reception of downlink communication according to the control information (Step S112). The base station 20 performs encoding by the erasure correction encoding method, addition of redundant data, and generation of a packet on the data of the downlink communication to the terminal device 40 so as to match the control information notified to the terminal device 40 (Step S113), and retransmits the packet to the terminal device 40 (Step S114).

Then, the terminal device 40 executes various processing (reception processing, demodulation processing, and decoding processing) including the erasure correction decoding processing according to the setting specified in the control information (Step S115). In the example of FIG. 11, the terminal device 40 has been successfully decoded here, and returns ACK to the base station 20 (Step S116).

Upon receiving the ACK, the base station 20 executes additional transmission determination processing (Step S117) and shifts to communication of the next new data.

3-2. Details of Operation of Communication System

Next, an operation of the communication system 1 will be described in detail.

As described above, the conventional communication device adds the error detection data having a constant length under any condition. The communication device according to the present embodiment realizes high frequency utilization efficiency by enabling the error detection data having an appropriate length to be added to the encoded sequence. Hereinafter, a specific method for realizing this will be described.

3-2-1. Error Detection Data Generation Method

First, a method of generating error detection data will be described. The error detection data is generated by the communication device on the transmission side. For example, when the communication device on the transmission side is the base station 20, the error detection data is generated by the generation unit 234 of the base station 20. Furthermore, when the communication device on the transmission side is the terminal device 40, the error detection data is generated by the generation unit 434 of the terminal device 40.

In the following description, a method of generating a value of CRC will be described as an example of a method of adding the error detection data. Note that the error detection data is not limited to the value of the CRC, and data other than the value of the CRC may be used as the error detection data as long as there is a positive proportional relationship between the length of the error detection data and the detection accuracy.

Figure 12:
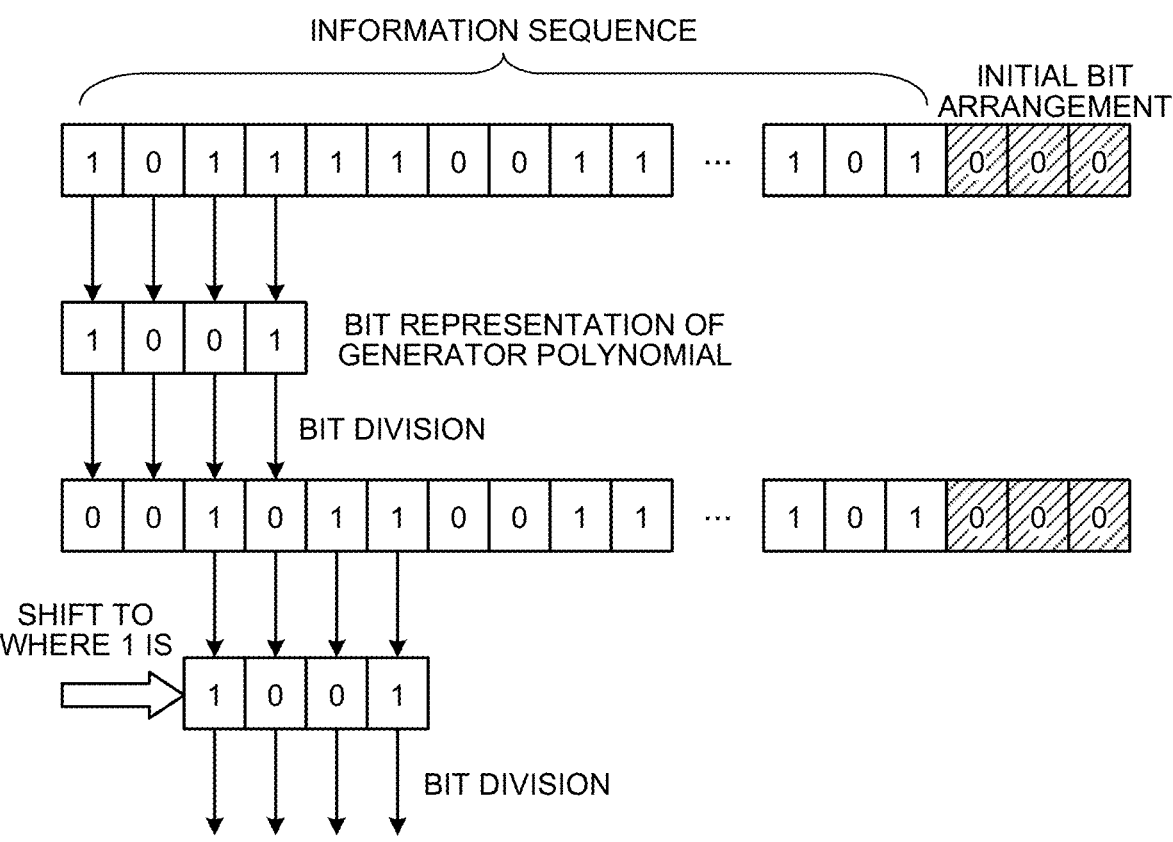
FIG. 12 is a schematic diagram of redundant data generation processing using CRC.
Figure 12:
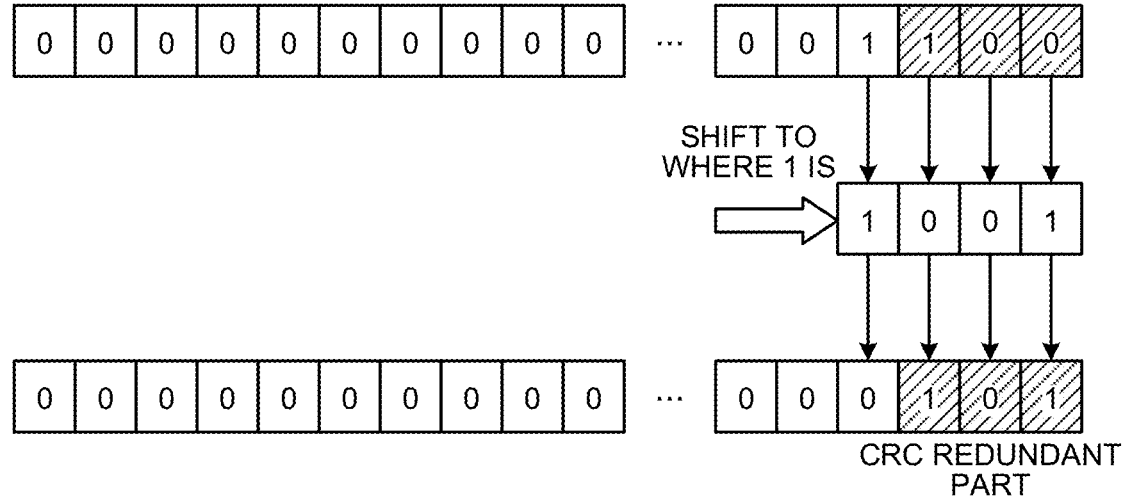

The CRC is a method in which division by a polynomial called a generator polynomial is used for an information sequence, and a remainder thereof is added to the information sequence as redundant bits. FIG. 12 is a schematic diagram of redundant data generation processing using CRC. A polynomial when an Nth-order polynomial is used as a generator polynomial is expressed as $f_N(x)$. The generator polynomial may be determined by selecting an atomic polynomial or a combination of orders with a large Hamming distance. $f_N(x)$ may be expressed by a bit string having a length of N+1. For example, $f_8(x)=x^8+x^7+x^1+1$ may be expressed as [1 1 0 0 0 0 0 1 1]. Furthermore, since the Nth-order polynomial has the Nth-order degree of 1 at all times, the most significant bit representation may be omitted in the bit representation. In the example of FIG. 12, a polynomial $f_3(x)=x^3+1$ with N=3 is used as a generator polynomial.

First, the communication device adds N initial bits to an end of an information sequence. A value of the initial value at this time is arbitrary. In the example of FIG. 12, the communication device sets the initial bit to [0 0 0]. Thereafter, the communication device finds a bit having 1 from the head of the information sequence, and performs unit division of the information sequence and the bits of the generator polynomial with the bit having 1 at the head. Thereafter, the communication device stores a division result at a position where the information series was included. The communication device repeats this operation until all bits of the information sequence become 0. An initial bit at the end of this operation, that is, a sum of the initial bit and a remainder obtained by dividing the information sequence by the generator polynomial is a CRC value (error detection data). At the time of decoding, the communication device performs the same processing as the value (error detection data) generation processing of the CRC at the time of transmission on the target reception information sequence, and compares the value (error detection data) of the CRC generated in the processing with the value (error detection data) of the CRC added to the reception information sequence. As a result, the communication device can detect an error in the information sequence.

The error detection capability of the CRC, the order of the generator polynomial, and the length of the information sequence have the following relationships (1) to (4).

(1) The Nth-order generator polynomial detects all burst errors having a length of N or less.

(2) The proportion of errors that are not detected with burst errors of length $M=N+1$ is $2^{-(N-1)}$.

(3) The proportion of errors that are not detected with burst errors of length $M>N+1$ is $2^{-N}$.

(4) The Nth-order generator polynomial detects all single errors and double errors when a length T of the information sequence is $T \leq 2^N - 1$.

In addition to this, there are error detection capability of the CRC, the order of the generator polynomial, and the theorem of the length of the information sequence, but these are omitted here. From this, it can be seen that a redundancy length provided by the CRC can be designed by the likelihood of an error rate of the information sequence and a length of the information sequence on the basis of an error detection rate to be achieved.

In the deleted word correction code, an error detection function is provided for each encoded sequence. The length of the encoded sequence is determined by the prior information before performing the deleted word correction code, and this prior information is a dynamic value that varies depending on the channel situation, the length of the information sequence received from the upper layer, and the resource size. Therefore, it can be said that it is not effective to use a single generator polynomial for error detection.

3-2-2. Determination of Length of Error Detection Data

The method of generating the error detection data has been described above. Next, processing related to the change of the length of the error detection data will be described.

The following processing is executed by the communication device on the transmission side. For example, when the communication device on the transmission side is the base station 20, the following processing is executed by the generation unit 234 of the base station 20. Furthermore, in a case where the communication device on the transmission side is the terminal device 40, the following processing is executed by the generation unit 434 of the terminal device 40.

(Determination Method by Length of Encoded Sequence)

The communication device on the transmission side can determine a length of the error detection data added to the one or the plurality of encoded sequences by a length of the one or the plurality of encoded sequences. At this time, the communication device may select the error detection method to be used from a plurality of error detection methods having different bit widths of the error detection data based on the length of the encoded sequence. At this time, the communication device may select the error detection method to be used from the plurality of error detection methods by applying the length of the one or the plurality of encoded sequences to a predetermined selection criterion. Here, the selection criterion is information for selecting the error detection method, and is information indicating a correspondence relationship between the length of the one or the plurality of encoded sequences and the error detection method.

For example, it is assumed that the error detection method is a generator polynomial used in the CRC. The communication device selects a generator polynomial used in the CRC by applying the encoded sequence length to a predetermined selection criterion. For example, the communication device selects a first-order generator polynomial when the encoded sequence length is $1<k<=K1$, and a fourth-order generator polynomial when $K1<k<K2$. Here, k is a code word length, and K1 and K2 are boundary values for generator polynomial switching. The boundary values may be regarded as the information of the selection criterion.

Note that the communication device on the reception side may acquire the information of the selection criteria (for example, the boundary values) or from another communication device that is a transmission partner of the plurality of encoded sequences. For example, when the communication device on the reception side is the terminal device 40, the terminal device 40 (for example, the acquisition unit 433 of the terminal device 40) may acquire the selection criterion information from the base station 20 as static information. Of course, the information of the selection criterion may be defined as a fixed value by a standard or the like. At this time, the communication device on the reception side may estimate the values of the boundary values from an error false detection rate estimated from the generator polynomial used in the CRC. For example, the communication device may estimate an error false detection estimation from the CRC detection capability and the length of the sequence length described above, and change the generator polynomial length to be used on the basis of the value.

(Determination Method by Estimated Error Rate)

The communication device on the transmission side can determine the length of the error detection data to be added to the encoded sequence on the basis of the error rate estimated when the encoded sequence is transmitted. For example, the communication device (for example, the acquisition unit 433 of the terminal device 40) may determine the length of the error detection data from the type of communication and the estimated value of the error rate based on the lower layer processing. Examples of the estimated value of the error rate include 5QI, QoS, and the like. For example, in 5G URLLC, coding is performed in the physical layer such that a bit error rate (BER) becomes $10^{-5}$ or less in units of transport blocks in the physical layer. In a case where the error correction code is decoded in a layer higher than the physical layer, the length of the CRC may be determined based on this information.

(Other Determination Methods)

The length of the error detection data added to the encoded sequence may be determined by a method combining the above two determination methods (a determination method based on the length of the encoded sequence and a determination method based on the estimated error rate).

The generator polynomial used for error detection is desirably a plurality of generator polynomials prepared in advance. At that time, it is desirable that the plurality of generator polynomials to be prepared is selected so as to be able to correspond to all of the assumed encoding sequence lengths and communication types. For example, the prepared plurality of generator polynomials may be the CRC-24, the CRC-8, and the CRC-1. The communication device may dynamically set the plurality of generator polynomials during communication. The communication device may set the plurality of generator polynomials statically or semi-statically. The plurality of generator polynomials used for error detection may be fixedly determined by a standard or the like.

Furthermore, the communication device may not add the error detection data to the one or the plurality of encoded sequences in some cases. For example, the communication device (for example, the addition unit 235 of the base station 20 or the addition unit 435 of the terminal device 40) may not include the error detection data in the redundant data in a case where the lengths of the one or the plurality of encoded sequences and the error rate estimated when the one or the plurality of encoded sequences are transmitted satisfy a predetermined standard.

3-2-3. Error Detection Processing on Reception Side

Next, error detection processing in the communication device on the reception side will be described.

Note that, when the communication device on the reception side is the base station 20, the following processing is executed by, for example, the reception unit 231 and/or the detection unit 236 of the base station 20. Furthermore, in a case where the communication device on the reception side is the terminal device 40, the following processing is executed by the reception unit 431 and/or the detection unit 436 of the terminal device 40, for example.

In order for the communication device on the reception side to perform error detection, the communication device on the reception side needs to know an error detection method (for example, a generator polynomial) used when the communication device on the transmission side generates error detection data. Hereinafter, a generator polynomial determination method on the reception side will be described by dividing the situation into cases.

First, processing in a case where the reception side is notified of the error detection method (for example, a generator polynomial) used by the communication device on the transmission side will be described. The information of the error detection method at this time may be transmitted as semi-static information or may be transmitted as dynamic information. Note that, in a case where the error detection method is the generator polynomial, the communication device on the transmission side may notify the communication device on the reception side of the bit representation of the generator polynomial used to generate the error detection data. At this time, the communication device on the transmission side may notify the bit representation of the generator polynomial in a form of being added to the redundant data of the specific encoded sequence. Of course, the error detection method may be notified by another method.

Next, processing in a case where a list of error detection methods (for example, the list information of the generator polynomial) used by the communication device on the transmission side is notified to the reception side will be described. In this case, it is assumed that the communication device on the reception side can know all the candidates of the error detection method (for example, a generator polynomial) used by the transmission side, but does not know which error detection method is actually used to generate the error detection data. The list of the error detection methods at this time may be transmitted as semi-static information or may be transmitted as dynamic information. Note that, in a case where the error detection method is the generator polynomial, the communication device on the transmission side may notify the communication device on the reception side of the bit representation of the generator polynomial used to generate the error detection data. At this time, the communication device on the transmission side may notify the bit representation of the generator polynomial in a form of being added to the redundant data of the specific encoded sequence. Of course, the error detection method may be notified by another method.

At this time, the communication device on the reception side desirably performs the error detection blindly using a list of the error detection methods. For example, it is assumed that the error detection method is a generator polynomial. Then, it is assumed that the communication device on the reception side acquires $f_k(x)$, $f_l(x)$, and $f_n(x)$ (k, l, n∈N) as a list of generator polynomials. In this case, the communication device on the reception side randomly selects one generator polynomial from the plurality of generator polynomials in the list, and attempts error detection. Thereafter, the communication device compares the end of the received encoded sequence. At this time, in a case where an error is detected, another generator polynomial is selected from the list, and the error detection is tried again. In a case where there is even one generator polynomial in which no error is detected, the communication device determines that the encoded sequence has no error. Conversely, in a case where an error is detected even if all the generator polynomials in the list are tested, the communication device determines that the sequence includes an error.

3-3. Example of Packetization

Next, an example related to packetization of the one or the plurality of encoded sequences will be described.

The following processing is executed by the communication device on the transmission side. For example, when the communication device on the transmission side is the base station 20, the following processing is executed by the transmission unit 232 and/or the addition unit 235 of the base station 20. Furthermore, in a case where the communication device on the transmission side is the terminal device 40, the following processing is executed by the transmission unit 432 and/or the addition unit 435 of the terminal device 40.

The communication device on the transmission side stores the one or the plurality of encoded sequences to which the redundant data is added in a data unit and transmits the data unit. In this case, in order for the communication device on the reception side to correctly restore the one or the plurality of encoded sequences from a packet, it is considered necessary for the communication device on the transmission side to previously provide information (Hereinafter, it is referred to as restoration information.) for restoring the one or the plurality of encoded sequences from the packet. Hereinafter, addition of the restoration information will be described.

3-3-1. Packetization

Before the restoration information is described, packetization will be described.

The encoded sequence to which the redundant data is added (hereinafter simply referred to as an encoded sequence in this section) usually moves in the communication device in order for the communication device to perform the transmission processing 2 in FIG. 7. This movement may be defined as, for example, movement to a layer lower than the layer in which the deleted word correction processing is located, or may be defined as movement in the same layer. At the time of this movement, the resource size may be notified from the transmission processing 2 side. For example, the RLC layer of 3GPP has a function of segmenting (dividing) the RLC SDU on the basis of a notification of a resource size from the MAC layer which is a lower layer and aligning the size of the SDU with that of the notification in the transmission processing.

It is necessary to perform processing corresponding to the above processing on the assumption of communication in the present embodiment. Hereinafter, combining and dividing the one or the plurality of encoded sequences to generate information sequences of different sizes is referred to as packetization.

3-3-2. Packet Configuration

FIG. 13 is a diagram illustrating a configuration of a packet. In a case where the communication device generates a packet from the one or the plurality of encoded sequences on the basis of the resource size notified from the next transmission processing, the packet configuration can be classified into configurations A to F as illustrated in FIG. 13. (Configuration A)

The configuration A assumes a case where the size of the packet and the size of the encoded packet are the same. In this case, one encoded sequence is always inserted into the packet.
(Configuration B)

The configuration B assumes a case where the packet size is larger than the encoded sequence size and the encoded sequence size is an integral multiple of the packet size. The integer value at this time is desirably a natural number of 2 or more. In this case, the packet is composed of only a plurality of complete encoded sequences.
(Configuration C)

The configuration C assumes that the size of the encoded sequence is not an integral multiple of the packet size, and a part of one encoded sequence is inserted into a remainder obtained by dividing the packet size by the size of the encoded sequence. That is, assuming that the packet size is M and the size of the encoded sequence is N, it is assumed that floor (M/N) encoded sequences are inserted into the packet and the encoded sequence divided into a size of M/N–floor (M/N) [bit] is inserted at the end of the packet. Here, floor (*) means an operation of rounding down the value of * to the decimal place.
(Configuration D)

The configuration D assumes a case where complete encoded sequences and two parts of one encoded sequence are inserted. Here, when the size of one sequence of the part of the encoded sequence is L, it is desirable that the size of the part of the other encoded sequence is configured by (M+L)/N–floor ((M+L)/N) [bit]. The two divided encoded sequences are desirably arranged at one end of the packet.
(Configuration E)

The configuration E assumes a case where a packet includes a complete encoded sequence, a part of one encoded sequence, and a 0-bit sequence. At this time, when the size of a part of the encoded sequence is L, the size of the 0-bit sequence is desirably configured by (M+L)/N–floor ((M+L)/N) [bit].
(Configuration F)

The configuration F assumes that the size of the encoded sequence is not an integral multiple of the packet size, and a part of the 0-bit sequence is inserted into a remainder of a value obtained by dividing the packet size by the size of the encoded sequence. That is, assuming that the packet size is M and the size of the encoded sequence is N, it is assumed that floor (M/N) encoded sequences are inserted into the packet and a 0-bit sequence having a size of M/N–floor (M/N) [bit] is inserted at the end of the packet.

3-3-3. Restoration Information

The communication device on the reception side needs to perform an operation of restoring the encoded sequence from the packet having the above configuration. In a case where this operation is performed, the communication device on the reception side needs to know the configuration of the packet. Therefore, the communication device on the transmission side provides information (restoration information) related to storage of one or a plurality of encoded sequences in the packet to the packet. The communication device may store the restoration information in the redundant data.

Note that the communication device on the transmission side may notify the restoration information by using a notification of dynamic control information related to the erasure correction code (for example, Steps S104 and S111 in FIG. 11, and the like). Furthermore, the communication device on the transmission side may notify the restoration information in a form of giving redundancy to the encoded packet or the packet configured by the 0-bit sequence. Furthermore, the communication device on the transmission side may notify the restoration information by a method other than the above.

The restoration information may include the following information (1) to (6). Note that the size of the received packet is known on the reception side. Furthermore, the information to be notified to the communication device on the reception side may include only a part of the following information.
(1) Information about Size of Coded Sequence Stored in Packet The restoration information may include information on the size of the encoded sequence included in the packet. The communication device may indicate the size by tabulating the size of the encoded sequence in advance and associating the value with the number.
(2) Packet Configuration Information The restoration information may include information indicating how the one or the plurality of encoded sequences are stored in the packet. For example, the restoration information may include information for distinguishing the configuration F from the configuration A in FIG. 13.
(3) Sequence Number The restoration information may include information (sequence number) for providing relevance between packets. A case is assumed where a packet to be transmitted is configured by some or all of the configurations C, D, and E in FIG. 13, and a part of one encoded sequence is included in separate packets. In that case, it is conceivable that the communication device on the transmission side gives a sequence number between packets in order for the communication device on the reception side to restore one encoded sequence from a plurality of packets. As an example, when one encoded sequence is distributed to two packets, the communication device on the transmission side gives consecutive sequence numbers to the packets. The communication device on the reception side attempts to restore the divided encoded sequence from the information related to the sequence number of the packet and the status of the divided code sequence.
(4) Number of Offsets of Division Bits When a packet to be transmitted is constituted by some or all of the configurations C, D, and E in FIG. 13, the communication device on the transmission side indicates in which part of the original encoded sequence the head or the end of the divided encoded sequence is located by a bit position. The head or end information may be described together.

(5) Status of Divided Encoded Sequence

When the packet to be transmitted is configured by some or all of the configurations C, D, and E in FIG. 13, the communication device on the transmission side stores information indicating the state of the divided encoded sequence in the restoration information. This information is used to distinguish, for example, a case where the divided sequence is the head of the original encoded sequence, a case where the divided sequence is the middle (non-head and non-terminal) of the original encoded sequence, and a case where the divided sequence is the terminal of the original code house sequence.

(6) Operation with Respect to Margin

The restoration information may include information regarding handling of a margin when the one or the plurality of encoded sequences are stored in the packet and the margin is generated. For example, the restoration information may include information for distinguishing the configurations C, D, E, and F in FIG. 13.

3-3-4. Configuration Example of Header and Restoration Processing

The communication device on the transmission side adds the restoration information to the header of the packet. The communication device on the transmission side may include the restoration information in the redundant data added to the one or the plurality of encoded sequences. Hereinafter, a method of adding the restoration information will be described.

In a case where a packet is configured only by the configuration A in certain communication, decoding can be performed on the reception side only by the information added to the encoded sequence, and thus, it is desirable that restoration information is not added.

In a case where a packet includes only the configuration B in certain communication, the encoded sequence can be restored if the size of the encoded sequence can be determined on the reception side. Therefore, it is desirable that the restoration information includes at least information of the size of the encoded sequence.

In a case where a packet includes only the configuration F in certain communication, the encoded sequence can be restored on the reception side by, for example, the following method. Therefore, it is desirable that the restoration information includes at least information of the size of the encoded sequence.

(1) Obtain a size of an encoded sequence.

(2) Bits are separated for each size of the encoded sequence from the head of the packet.

(3) Drop terminal bits less than the size of the encoded sequence.

In a case where a packet includes configurations B, C, D, and E in certain communication, the restoration processing of the encoded sequence is processed as follows, for example.

(1) Identification is performed based on information indicating a configuration of the received packet. (For example, 00: configuration B, 01: configuration C, 10: configuration D, 11: configuration E)

(2) In the case of the configuration B, the bits are separated for each size of the encoded sequence from the head of the packet.

(3) In the case of the configuration C, (a) Bits are separated for each size of the encoded sequence from the head of the packet.

(b) The terminal bits less than the size of the encoded sequence, the status and sequence number of the divided encoded sequence assigned to the packet, and the number of offsets of the divided bits are stored in the buffer.

(4) In the case of configuration D, (a) A divided encoded sequence is cut out based on the number of offsets of the divided bits, and the status and sequence number of the divided encoded sequence and the number of offsets of the divided bits assigned to the sequence and the packet are stored in a buffer.

(b) For the packet after the processing of (a), bits are separated for each encoded sequence size from the head.

(c) The terminal bits less than the size of the encoded sequence, the status and sequence number of the divided encoded sequence assigned to the packet, and the number of offsets of the divided bits are stored in the buffer.

(5) In the case of configuration E, (a) A divided encoded sequence is cut out based on the number of offsets of the divided bits, and the status and sequence number of the divided encoded sequence and the number of offsets of the divided bits assigned to the sequence and the packet are stored in a buffer.

(b) For the packet after the processing of (a), bits are separated for each encoded sequence size from the head.

(c) Drop terminal bits less than the size of the encoded sequence.

(6) The divided information sequence stored in the buffer is restored based on the information. Therefore, in a case where the packet is configured by the configurations C, D, and E in the communication, the restoration information desirably includes at least the size of the encoded sequence, the status or sequence number of the divided sequence, and the number of offsets of the divided bits.

4. Configuration Example of Communication to which Present Embodiment is Applicable Hereinafter, a configuration example of a communication device to which the present embodiment can be applied will be described.

4-1. Configuration Example 1

First, a configuration example in a case where an erasure correction code is used as an alternative to packet duplication in a dual connectivity (DC)/carrier aggregation (CA) environment will be described.

In the DA/CA in the 5G standard, communication is performed using a plurality of communication paths (carriers) for a single terminal, thereby achieving improvement in communication reliability and expansion of communication capacity. In particular, as a method of improving reliability in DC/CA, multiplexing transmission of the same data by PDCP Duplication can be mentioned. This is a method of replicating the PDCP PDU at the PDCP layer and transmitting the PDCP PDU through each communication path.

Figure 14:
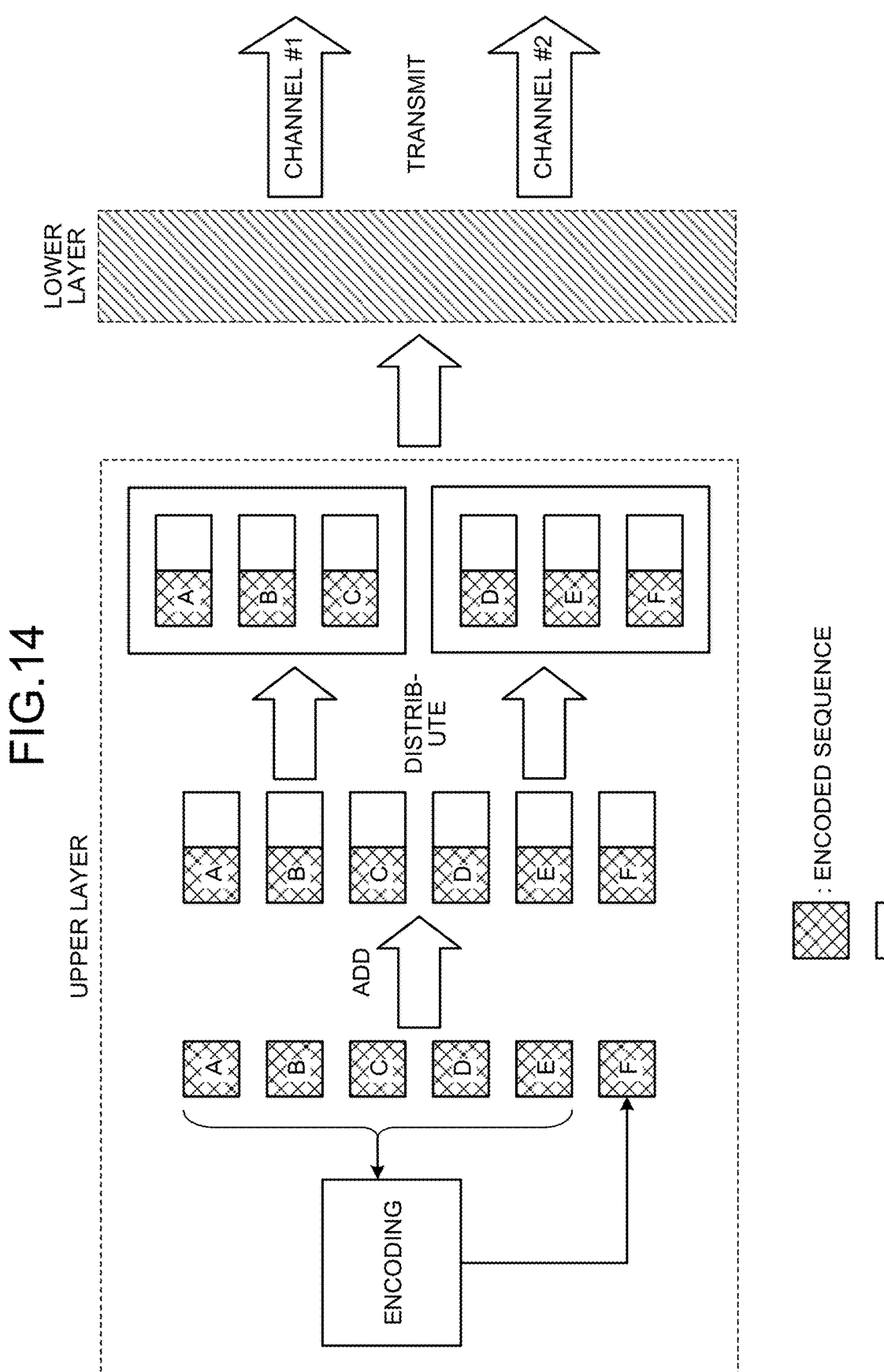
FIG. 14 is a diagram illustrating an operation of an erasure correction code in a case where a single communication device performs communication using a plurality of communication paths.
Figure 15:
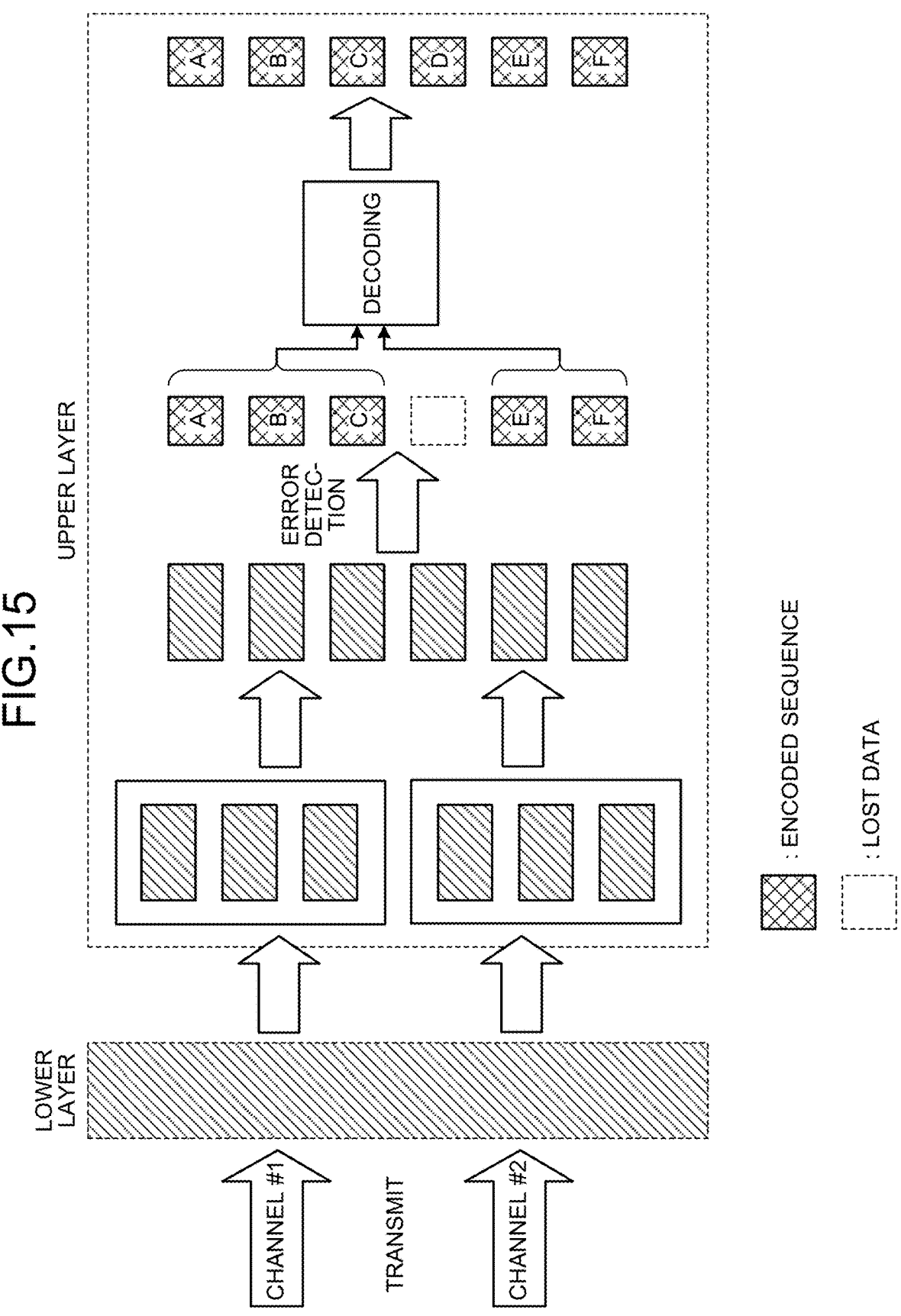
FIG. 15 is a diagram illustrating an operation of an erasure correction code in a case where a single communication device performs communication using a plurality of communication paths.

FIGS. 14 and 15 are diagrams illustrating the operation of the erasure correction code in a case where a single communication device performs communication using a plurality of communication paths. In the examples of FIGS. 14 and 15, the number of communication paths to be used is set to 2, but may be any natural number of 2 or more. Furthermore, the method for distribution and the number of encoded sequences to be generated may be arbitrary values. Furthermore, the function of providing redundancy for error detection may be processed after distribution according to a channel using an encoded sequence.

In the examples of FIGS. 14 and 15, it is assumed that the erasure correction code is applied as the reliability improvement method instead of the PDCP Duplication. The transmission side is assumed to have a function of performing erasure correction encoding on a single or a plurality of PDCP SDUs, a function of adding an error detection function to each encoded sequence, a function of distributing a plurality of encoded sequences to which the error detection function is added according to the number and state of used communication paths, and a function of processing the distributed sequences into PDCP PDUs for each distributed group. It is assumed that the reception side has at least a function of restoring the PDCP PDU received from each communication path into an encoded sequence, an error detection function in units of code-sequences by the error detection function, and a function of performing erasure correction decoding using only an encoded sequence not including an error.

In a case where the present embodiment is applied with this assumption, the following needs to be additionally considered.

(1) Item Related to Redundant Length Having Assigned Error Detection Function

In an environment where DC/CA is performed, a plurality of PDUs generated on the basis of the distributed encoded sequence may be processed by different independent RLC entities (for example, dual connectivity using a plurality of base stations). Therefore, in a case where the size of the redundancy to be allocated is determined by the channel state or the lower layer processing, it is desirable that the error detection function is performed after the coding symbol distribution, and the size is determined in units of the distributed unit.

(2) Item for Generating PDCP PDU from Distributed Sequence

In a case where the PDCP PDU is generated from the correction code sequence to which a plurality of error detection functions is added on the basis of the above assumption, the generated PDU can perform communication in all states illustrated in FIG. 13. However, in consideration of performing low-delay processing, it is not preferable to distribute the divided encoded sequence to a plurality of communication paths.

For example, in a case where communication is performed using two communication paths, a state in which the state of one of the communication paths rapidly deteriorates during the communication processing and a temporary communication interruption state is assumed. In this case, if the divided encoded sequences are arranged so as to be distributed to the respective communication paths, it is difficult to restore the divided encoded sequences.

Furthermore, it is assumed that the transmission delay is different for each communication path, and it is considered that the divided encoded sequences are arranged so as to be distributed to the respective communication paths. In this case, in order to restore the divided encoded sequence, it is necessary to wait for the divided encoded sequence to arrive from both communication paths, which leads to an increase in delay.

In the erasure correction code, since the correction capability of the encoded sequence is set to be an equivalent value for each encoded sequence, in the case of the above example, for example, it is more effective in terms of the amount of delay and complexity in a case where processing such as adjusting the size of the PDCP PDU and transmitting only the undivided encoded sequence or performing zero padding in the margin of the PDCP PDU filled with the encoded sequence is performed.

4-2. Configuration Example 2

Next, a configuration example in a case where the erasure correction code is used as a substitute for the RLC ARQ will be described.

The RLC layer has a function (RLC ARQ) of retransmitting data for which reception/physical layer decoding has failed in units of segmented RLC SDUs and a function of dividing the RLC SDUs on the basis of a size notified from the MAC layer. Processing in a case where replacement with an erasure correction code and application of the present invention are performed for these functions will be described.

A configuration assumed here has a function of performing erasure correction encoding on a single or a plurality of RLC SDUs on a transmission side, a function of adding an error detection function to an encoded sequence, a function of generating an RLC PDU from one or a plurality of or a part of encoded sequences on the basis of a notification from a MAC layer, and a function of generating an additional RLC PDU from an encoded sequence on the basis of ACK/NACK from a reception side, and it is conceivable that the reception side has at least a function of restoring an encoded sequence from an RLC PDU, a function of detecting an error of an encoded sequence, a function of performing erasure correction decoding using an encoded sequence not including an error, and a function of notifying a transmission side of ACK/NACK on the basis of a decoding result or the number of encoded sequences not including a received error.

The present embodiment is also effective in the above configuration.

In the RLC ARQ, retransmission is performed in units of segmented RLC SDUs based on the NACK on the reception side, but when the erasure correction code is applied, it is desirable to transmit an additional erasure correction encoded sequence instead of the same data. This is because the correction capability of the encoded sequence is equal. Furthermore, in a case where the retransmission processing is performed, since the length of the encoded sequence is known on the reception side, it is not necessary to notify the size of the encoded sequence in the information given when the packet is generated from the plurality of encoded sequences.

Furthermore, the redundancy for error detection included in the encoded sequence included in the PDU generated at the time of retransmission does not necessarily have the same length as that at the time of initial transmission, and may be variable according to a channel, lower layer processing, and a PDU size.

5. Modification Examples

The above-described embodiments are examples, and various modifications and applications are possible.

For example, in the above-described embodiment, the communication device on the transmission side is the base station 20 or the terminal device 40, and the communication device on the reception side is the terminal device 40 or the base station 20, but the communication device on the transmission side and the communication device on the reception side are not limited to this example. For example, the communication device on the transmission side may be the terminal device 40, and the communication device on the reception side may be the terminal device 40. Furthermore, the communication device on the transmission side may be the base station 20, and the communication device on the reception side may be the base station 20. In addition, the relay station 30 may be included in either or both of the communication device on the transmission side and the communication device on the reception side.

The control device that controls the management device 10, the base station 20, the relay station 30, and the terminal device 40 of the present embodiment may be realized by a dedicated computer system or a general-purpose computer system.

For example, a communication program for executing the above-described operation is stored and distributed in a computer-readable recording medium such as an optical disk, a semiconductor memory, a magnetic tape, or a flexible disk. Then, for example, the program is installed in a computer, and the above-described processing is executed to configure the control device. At this time, the control device may be a device (for example, a personal computer) outside the management device 10, the base station 20, the relay station 30, and the terminal device 40. Furthermore, the control device may be a device (for example, the control unit 13, the control unit 23, the control unit 33, and the control unit 43) inside the management device 10, the base station 20, the relay station 30, and the terminal device 40.

Furthermore, the communication program may be stored in a disk device included in a server device on a network such as the Internet so that the communication program can be downloaded to a computer. Furthermore, the above-described functions may be realized by cooperation of an operating system (OS) and application software. In this case, a portion other than the OS may be stored in a medium and distributed, or a portion other than the OS may be stored in a server device and downloaded to a computer.

Among the processing described in the above embodiments, all or a part of the processing described as being performed automatically can be performed manually, or all or a part of the processing described as being performed manually can be performed automatically by a known method. In addition, the processing procedure, specific name, and information including various data and parameters illustrated in the document and the drawings can be arbitrarily changed unless otherwise specified. For example, the various types of information illustrated in each drawing are not limited to the illustrated information.

Furthermore, each component of each device illustrated in the drawings is functionally conceptual, and is not necessarily physically configured as illustrated in the drawings. That is, a specific form of distribution and integration of each device is not limited to the illustrated form, and all or a part thereof can be functionally or physically distributed and integrated in an arbitrary unit according to various loads, usage conditions, and the like. Note that this configuration by distribution and integration may be performed dynamically.

Furthermore, the above-described embodiments can be appropriately combined in a region in which the processing contents do not contradict each other. Furthermore, the order of each step illustrated in the flowchart of the above-described embodiment can be appropriately changed.

Furthermore, for example, the present embodiment can be implemented as any configuration constituting a device or a system, for example, a processor as a system large scale integration (LSI) or the like, a module using a plurality of processors or the like, a unit using a plurality of modules or the like, a set obtained by further adding other functions to a unit, or the like (that is, a configuration of a part of the device).

Note that, in the present embodiments, the system means a set of a plurality of components (devices, modules (parts), etc.), and it does not matter whether or not all the components are in the same housing. Therefore, a plurality of devices housed in separate housings and connected via a network and one device in which a plurality of modules is housed in one housing are both systems.

Furthermore, for example, the present embodiments can adopt a configuration of cloud computing in which one function is shared and processed by a plurality of devices in cooperation via a network.

6. Conclusion

As described above, the communication device (for example, the base station 20 and the terminal device 40) of the present embodiment generates error detection data (for example, the value of CRC) for detecting an error of one or a plurality of encoded sequences generated by the erasure correction encoding processing, and adds redundant data including the error detection data to one or a plurality of encoded sequences. At this time, the communication device generates error detection data having different lengths according to a predetermined condition. For example, the communication device generates error detection data having a length determined based on a length of the one or the plurality of encoded sequences. Alternatively, the communication device generates error detection data having a length determined based on an error rate estimated when the one or the plurality of encoded sequences are transmitted. As a result, the communication device according to the present embodiment can add redundant data of an appropriate length to the encoded sequence, and thus, can realize high frequency utilization efficiency.

Although the embodiments of the present disclosure have been described above, the technical scope of the present disclosure is not limited to the above-described embodiments as it is, and various modifications can be made without departing from the gist of the present disclosure. Furthermore, components of different embodiments and modification examples may be appropriately combined.

Furthermore, the effects of each embodiment described in the present specification are merely examples and are not limited, and other effects may be provided.

Note that the present technique can also have the following configurations.

(1)

A communication device comprising:

a generation unit that generates error detection data; and an addition unit that adds redundant data including the error detection data to one or a plurality of encoded sequences generated by encoding processing, wherein the error detection data is used for error detection of the one or the plurality of encoded sequences, and the generation unit generates the error detection data having different lengths according to a predetermined condition.

(2)

The communication device according to (1), wherein the generation unit generates the error detection data having a length determined based on a length of the one or the plurality of encoded sequences.

(3)

The communication device according to (2), wherein the generation unit selects an error detection method to be used from among a plurality of error detection methods having different bit widths of the error detection data based on the length of the one or the plurality of encoded sequences, and generates the error detection data based on the selected error detection method.

(4)

The communication device according to (3), further comprising an acquisition unit that acquires information indicating a correspondence relationship between the length of the one or the plurality of encoded sequences and the error detection method, the information being information of a selection criterion for selecting the error detection method, wherein the generation unit selects the error detection method to be used from among the plurality of error detection methods based on the information and the length of the one or the plurality of encoded sequences, and generates the error detection data based on the selected error detection method.

(5)

The communication device according to (4), wherein the acquisition unit acquires the information from another communication device that is a transmission partner of the one or the plurality of encoded sequences.

(6)

The communication device according to (4), wherein the acquisition unit determines the selection criterion based on an error detection capability of the error detection method.

(7)

The communication device according to (1), wherein the generation unit generates the error detection data having a length determined based on an estimated error rate.

(8)

The communication device according to any one of (1) to (7), wherein the addition unit does not include the error detection data in the redundant data in a case where a length of the one or the plurality of encoded sequences and an estimated error rate satisfy a predetermined criterion.

(9)

The communication device according to any one of (1) to (8), wherein the error detection data is a value of cyclic redundancy checking (CRC).

(10)

The communication device according to any one of (1) to (9), further comprising a transmission unit that stores the one or the plurality of encoded sequences in a packet together with the redundant data, and transmits the packet, wherein the addition unit stores, in the redundant data, information regarding storage of the one or the plurality of encoded sequences in the packet.

(11)

The communication device according to (10), wherein the addition unit stores restoration information for restoring the one or the plurality of encoded sequences from the packet in the redundant data.

(12)

The communication device according to (11), wherein the restoration information includes information on a size of the encoded sequences stored in the packet.

(13)

The communication device according to (11), wherein the restoration information includes at least configuration information of the packet indicating how the one or the plurality of encoded sequences are stored in the packet.

(14)

The communication device according to (13), wherein the restoration information includes information regarding handling of a margin in a case where the one or the plurality of encoded sequences are stored in the packet and the margin is generated.

(15)

The communication device according to (14), wherein in a case where a part of the encoded sequences is stored in the margin, the addition unit stores, in the restoration information, a sequence number of the encoded sequences part of which is stored in the margin and information for identifying which part of the encoded sequences is a part of the encoded sequences stored in the margin.

(16)

A communication device that communicates with another communication device including a generation unit that generates error detection data for error detection of one or a plurality of encoded sequences generated by encoding processing, the generation unit generating the error detection data having different lengths according to a predetermined condition, and an addition unit that adds redundant data including at least the error detection data to the one or the plurality of encoded sequences, the communication device comprising:

a reception unit that receives the one or the plurality of encoded sequences to which the redundant data is added from the another communication device; and an error detection unit that performs error detection of the one or the plurality of encoded sequences based on the error detection data included in the redundant data.

(17)

The communication device according to (16), wherein the another communication device is configured to generate the error detection data to be included in the redundant data based on an error detection method selected from a plurality of error detection methods having different bit widths of the error detection data, the reception unit acquires information regarding the error detection method used to generate the error detection data from the another communication device, and the error detection unit performs error detection of the one or the plurality of encoded sequences based on the information regarding the error detection method and the error detection data.

(18)

The communication device according to (17), wherein the information regarding the error detection method is list information of the plurality of error detection methods, and the error detection unit performs error detection of the one or the plurality of encoded sequences by sequentially executing the error detection methods included in the list information.

(19)

A communication method comprising:

a generation step of generating error detection data; and an addition step of adding redundant data including at least the error detection data to one or a plurality of encoded sequences generated by encoding processing, wherein the error detection data is used for error detection of the one or the plurality of encoded sequences, and in the generation step, the error detection data having different lengths is generated according to a predetermined condition.

(20)

A communication method executed by a communication device that communicates with another communication device including a generation unit that generates error detection data for error detection of one or a plurality of encoded sequences generated by encoding processing, the generation unit generating the error detection data having different lengths according to a predetermined condition, and an addition unit that adds redundant data including at least the error detection data to the one or the plurality of encoded sequences, the communication method comprising:

a reception step of receiving the one or the plurality of encoded sequences to which the redundant data is added from the another communication device; and an error detection step of performing error detection of the one or the plurality of encoded sequences based on the error detection data included in the redundant data.

REFERENCE SIGNS LIST

1 COMMUNICATION SYSTEM
10 MANAGEMENT DEVICE
20 BASE STATION
30 RELAY STATION
40 TERMINAL DEVICE
11 COMMUNICATION UNIT
21, 31, 41 WIRELESS COMMUNICATION UNIT
12, 22, 32, 42 STORAGE UNIT
13, 23, 33, 43 CONTROL UNIT
211, 311, 411 TRANSMISSION PROCESSING UNIT
212, 312, 412 RECEPTION PROCESSING UNIT
213, 313, 413 ANTENNA
231, 431 RECEPTION UNIT
232, 432 TRANSMISSION UNIT
233, 433 ACQUISITION UNIT
234, 434 GENERATION UNIT
235, 435 ADDITION UNIT
236, 436 DETECTION UNIT

The invention claimed is:

1. A first communication device, comprising:

a signal processing unit configured to generate a plurality of encoded sequences based on an encoding processing operation;

an acquisition unit configured to acquire information of a first criterion, wherein the information indicates a correspondence between a length of at least one of the plurality of encoded sequences and one of a plurality of error detection methods;

a generation unit configured to:

select, based on the information of the first criterion and the length of the at least one of the plurality of encoded sequences, an error detection method from the plurality of error detection methods; and generate error detection data based on the selected error detection method; and an addition unit configured to add redundant data including the error detection data to the at least one of the plurality of encoded sequences, wherein the error detection data is for error detection of the at least one of the plurality of encoded sequences, and the generation unit is further configured to generate the error detection data having a plurality of lengths based on a specific condition.

2. The first communication device according to claim 1, wherein the generation unit is further configured to:

determine a specific length from the plurality of lengths of the error detection data based on the length of the at least one of the plurality of encoded sequences; and generate the error detection data that has the specific length.

3. The first communication device according to claim 2, wherein the plurality of error detection methods includes different bit widths of the error detection data based on the length of the at least one of the plurality of encoded sequences.

4. The first communication device according to claim 1, wherein the acquisition unit is further configured to acquire the information from a second communication device that is a transmission partner of the at least one of the plurality of encoded sequences.

5. The first communication device according to claim 1, wherein the acquisition unit is further configured to determine the first criterion based on an error detection capability of the error detection method.

6. The first communication device according to claim 1, wherein the generation unit is further configured to:

determine a specific length from the plurality of lengths of the error detection data based on an estimated error rate; and generate the error detection data having the specific length.

7. The first communication device according to claim 1, wherein the addition unit is further configured to not add the error detection data in the redundant data in a case where the length of the at least one of the plurality of encoded sequences and an estimated error rate satisfy a second criterion.

8. The first communication device according to claim 1, wherein the error detection data is a value of cyclic redundancy checking (CRC).

9. The first communication device according to claim 1, further comprising:

a transmission unit configured to:

store the at least one of the plurality of encoded sequences in a packet together with the redundant data, and transmit the packet, wherein the addition unit is further configured to store, in the redundant data, information regarding storage of the at least one of the plurality of encoded sequences in the packet.

10. The first communication device according to claim 9, wherein the addition unit is further configured to store restoration information to restore the at least one of the plurality of encoded sequences from the packet.

11. The first communication device according to claim 10, wherein the restoration information includes information on a size of the at least one of the plurality of encoded sequences stored in the packet.

12. The first communication device according to claim 10, wherein the restoration information includes at least configuration information of the packet indicating a process of storage of the at least one of the plurality of encoded sequences in the packet.

13. The first communication device according to claim 12, wherein the restoration information includes information regarding handling of a margin in a case where the at least one of the plurality of encoded sequences are stored in the packet and the margin is generated to store a part of a plurality of parts of an encoded sequence of the plurality of encoded sequences.

14. The first communication device according to claim 13, wherein in a case where the part of the encoded sequence of the plurality of encoded sequences is stored in the margin, the addition unit is further configured to store, in the restoration information:

a sequence number of the encoded sequence of the plurality of encoded sequences, and information to identify which part of the plurality of parts of the encoded sequence is the part stored in the margin.

15. A first communication device, comprising:

in a case where the first communication device communicates with a second communication device, and the second communication device includes:

a generation unit that generates error detection data for error detection of at least one of a plurality of encoded sequences generated by encoding processing, wherein the error detection data having a plurality of lengths based on a specific condition, and an addition unit that adds redundant data including at least the error detection data to the at least one of the plurality of encoded sequences, a reception unit configured to receive the at least one of the plurality of encoded sequences to which the redundant data is added from the second communication device; and an error detection unit configured to execute error detection of the at least one of the plurality of encoded sequences based on the error detection data included in the redundant data.

16. The first communication device according to claim 15, wherein the second communication device generates the error detection data that is included in the redundant data based on an error detection method selected from a plurality of error detection methods having different bit widths of the error detection data, the reception unit is further configured to acquire information regarding the error detection method used to generate the error detection data from the second communication device, and the error detection unit is further configured to execute error detection of the at least one of the plurality of encoded sequences based on the information regarding the error detection method and the error detection data.

17. The first communication device according to claim 16, wherein the information regarding the error detection method is list information of the plurality of error detection methods, and the error detection unit is further configured to execute error detection of the at least one of the plurality of encoded sequences based on sequential execution of the error detection methods included in the list information.

18. A communication method, comprising:

generating a plurality of encoded sequences based on an encoding processing operation;

acquiring information of a specific criterion, wherein the information indicates a correspondence between a length of at least one of the plurality of encoded sequences and one of a plurality of error detection methods;

selecting, based on the information of the specific criterion and the length of the at least one of the plurality of encoded sequences, an error detection method from the plurality of error detection methods;

generating error detection data based on the selected error detection method;

adding redundant data including the error detection data to the at least one of the plurality of encoded sequences, wherein the error detection data is for error detection of the at least one of the plurality of encoded sequences; and generating the error detection data having a plurality of lengths based on a specific condition.

19. A communication method executed by a first communication device, the communication method comprising:

in a case where the first communication device communicates with a second communication device, and the second communication device includes:

a generation unit that generates error detection data for error detection of at least one of a plurality of encoded sequences generated by encoding processing, wherein the error detection data having a plurality of lengths based on a specific condition, and an addition unit that adds redundant data including at least the error detection data to the at least one of the plurality of encoded sequences, receiving at least one of the plurality of encoded sequences to which the redundant data is added from the second communication device; and executing error detection of the at least one of the plurality of encoded sequences based on the error detection data included in the redundant data.

\* \* \* \* \*